(12) United States Patent
Takeishi et al.

(10) Patent No.: US 6,778,038 B2
(45) Date of Patent: Aug. 17, 2004

(54) PIEZOELECTRIC RESONANT FILTER, DUPLEXER, AND METHOD OF MANUFACTURING SAME

(75) Inventors: Taku Takeishi, Tokyo (JP); Katsuhiko Gunji, Tokyo (JP); Eiju Komuro, Tokyo (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 10/260,265

(22) Filed: Oct. 1, 2002

(65) Prior Publication Data

US 2003/0117238 A1 Jun. 26, 2003

(30) Foreign Application Priority Data

Oct. 5, 2001 (JP) ........................................ 2001-309363

(51) Int. Cl.[7] .............................. H03H 9/70; H03H 9/54; H03H 9/56; H03H 3/02; B23K 1/06
(52) U.S. Cl. ...................... 333/133; 333/189; 333/191; 228/110.1; 29/25.35
(58) Field of Search .................... 333/133, 186–196; 228/110.1; 29/25.35

(56) References Cited

U.S. PATENT DOCUMENTS

| | | | |
|---|---|---|---|
| 4,642,508 A | 2/1987 | Suzuki et al. | 310/321 |
| 5,872,493 A | 2/1999 | Ella | 333/191 |
| 5,991,989 A * | 11/1999 | Onishi et al. | 29/25.35 |
| 6,202,915 B1 * | 3/2001 | Sato | 228/110.1 |
| 6,349,870 B1 * | 2/2002 | Kimura et al. | 228/110.1 |
| 6,509,813 B2 * | 1/2003 | Ella et al. | 333/187 |
| 2002/0070262 A1 | 6/2002 | Bradley et al. | 228/179.1 |

FOREIGN PATENT DOCUMENTS

| | | | |
|---|---|---|---|
| JP | 10-107078 | * | 4/1998 |
| JP | A 2000-278078 | | 10/2000 |

OTHER PUBLICATIONS

Nakamura, Kiyoshi et al., "Thin Film Resonators and Filters," International Symposium on Acoustic Wave Devices for Future Mobile Communication Systems, pp. 93–99 (Mar. 5–Mar. 7, 2001).

Yatsuda, Hiromi et al., "Miniaturized SAW Filters Using a Flip–Chip Technique," IEEE Transactions on Ultrasonics, Ferroelectrics, and Frequency Control, vol. 43, No. 1, pp. 125–130 (Jan. 1996).

* cited by examiner

*Primary Examiner*—Barbara Summons
(74) *Attorney, Agent, or Firm*—Oliff & Berridge, PLC

(57) ABSTRACT

A piezoelectric resonant filter comprises a chip having a plurality of thin-film piezoelectric resonators, and a mounting substrate on which the chip is mounted. The chip is mounted on the mounting substrate by flip chip bonding. A plurality of bumps provided on the chip are bonded to a plurality of conductors on the mounting substrate by inter-diffusion between atoms, in a solid phase, of the respective metals of which the bumps and the conductors are made, without involving melting of the respective metals of which the bumps and the conductors are made. The chip has a series resonator and a parallel resonator each formed of a thin-film piezoelectric resonator. These resonators constitute a ladder filter circuit.

9 Claims, 16 Drawing Sheets

PIEZOELECTRIC RESONANT FILTER, DUPLEXER, AND METHOD OF MANUFACTURING SAME

BACKGROUND OF THE INVENTION

1. Field of the Invention

The invention relates to a piezoelectric resonant filter including a thin-film piezoelectric resonator, a duplexer including the resonant filter, and manufacturing methods thereof.

2. Description of the Related Art

Mobile communications devices such as mobile phones, which have dramatically become widespread in recent years, have been miniaturized and have attained higher usable frequencies year by year. In response to this, it is desired that electronic components for use with such mobile communications devices also be miniaturized and made usable at higher frequencies.

Some mobile communications devices include a duplexer for switching between a transmission signal path and a reception signal path in order to share a single antenna for both transmitting and receiving signals. The duplexer has a filter for allowing a transmission signal to pass therethrough and interrupting a reception signal, and a filter for allowing the reception signal to pass therethrough and interrupting the transmission signal.

In recent years, some of the aforementioned duplexers incorporate a surface acoustic wave filter. The surface acoustic wave filters have features that they are usable at frequencies up to about several gigahertz and can be made more compact than ceramic filters. However, usable frequencies of mobile communications devices can become even higher in the future, while under the present situation there remain many technical problems for the surface acoustic wave filters to become usable at such high frequencies.

In this regard, attention has been focused lately on a thin-film piezoelectric resonator, which is also called a thin-film bulk acoustic resonator (hereinafter also referred to as FBAR). The thin-film piezoelectric resonator utilizes resonance of a piezoelectric thin film in a direction of its thickness. Changing the thickness of the piezoelectric thin film can change the resonant frequency of the thin-film piezoelectric resonator. The thin-film piezoelectric resonator is expected to be capable of responding to frequencies up to several gigahertz.

Such a thin-film piezoelectric resonator is described, for example, in the following documents:

Published Unexamined Japanese Patent Application (KOKAI) No. 2000-278078;

U.S. Pat. No. 5,872,493;

U.S. Pat. No. 4,642,508;

U.S. patent application Publication No. 2002/0070262 A1; and a paper entitled "Thin Film Resonators and Filters", Kiyoshi Nakamura et al., presented at International Symposium on Acoustic Wave Devices for Future Mobile Communication Systems, Mar. 5–7, 2001, pp. 93–99.

A thin-film piezoelectric resonator comprises a piezoelectric thin film, two electrodes disposed on both surfaces of the piezoelectric thin film, and a base body for supporting the piezoelectric thin film and the electrodes. The base body may have a cavity which forms an opening on a side opposite to the side on which the piezoelectric thin film and the two electrodes are disposed (see Published Unexamined Japanese Patent Application (KOKAI) No. 2000-278078 and U.S. Pat. No. 5,872,493). Otherwise, a gap may be formed between one of the electrodes and the base body (see U.S. Pat. No. 4,642,508). Otherwise, the piezoelectric thin film and the two electrodes may be disposed on an acoustic multi-layered film on the base body, without cavity or gap (see Kiyoshi Nakamura et al.).

Filters employing a resonator include a ladder filter. A ladder filter includes a series resonator and a parallel resonator, as a basic configuration. As necessary, a plurality of the basic configurations are connected in a cascaded manner to make up a ladder filter.

Now, for example, suppose that a filter including a plurality of resonators such as the aforementioned ladder filter is packaged. In this case, a chip including filter components is formed and then the chip is mounted onto a mounting substrate to thereby fabricate a packaged filter.

Conventionally, to package a filter including a plurality of resonators, a wire bonding method has been widely employed for establishing electrical connection between the chip and the mounting substrate (see U.S. Pat. No. 5,872,493).

Now, a method for establishing electrical connection between the chip and the mounting substrate by wire bonding will be briefly described. In this method, the chip including the base body and elements mounted thereon is placed on the mounting substrate such that the surface of the base body having the elements mounted thereon faces upward, and then bonded onto the mounting substrate using an adhesive or the like. The chip is provided with connection electrodes, and the mounting substrate is provided with connection pads. The connection electrodes and the connection pads are connected to each other with thin metal wires. For example, the thin metal wires are 20 to 30 $\mu$m in diameter. The thin metal wires are made of a material such as gold or aluminum. Connection between the thin metal wires and the connection electrodes, or connection between the thin metal wires and the connection pads is established by thermo-compression bonding, ultrasonic bonding, or a combination thereof.

When the electrical connection between the chip and the mounting substrate is established by wire bonding, the thin metal wires cause an extra parasitic inductance between the chip and the mounting substrate. The extra parasitic inductance caused by the aforementioned thin metal wires may result in a shift of the electrical properties of the filter from desired ones, even when the chip has been fabricated so as to obtain the desired electrical properties of the filter. The electrical properties of the filter include frequencies for determining the passband of the filter, center frequency of the passband, insertion loss, and the amount of attenuation in an attenuation band.

For conventional filters used in a frequency band of 1 GHz or less, for example, a shift of the electrical properties of the filters caused by the aforementioned extra parasitic inductance is slight and has been neglected.

However, for filters used in a high frequency band of several GHz to the order of 10 GHz such as piezoelectric resonant filters employing a thin-film piezoelectric resonator, a shift of the electrical properties of the filters caused by the aforementioned extra parasitic inductance is non-negligibly great.

To avoid such a problem as mentioned above, as a method for establishing electrical connection between the chip and the mounting substrate, it is proposed that a solder bumps provided on the chip are directly connected to the connection pads of the mounting substrate by flip chip bonding (see U.S. patent application Publication No. 2002/0070262 A1).

Now, briefly described is an example of a method for establishing electrical connection between the chip and the mounting substrate by the aforementioned flip chip bonding. In this method, first, fine solder bumps having a diameter of several tens to 100 μm or so are formed on the connection pads provided on the chip by using a high-melting solder. On the other hand, the connection pads provided on the mounting substrate are pre-coated with solder by using a procedure such as plating, thick-film printing of solder paste, and vapor deposition. The solder bumps are then soaked in flux. The chip is then positioned and mounted on the mounting substrate such that the solder bumps of the chip face the connection pads of the mounting substrate. Then, with this state remained unchanged, the solder with which the connection pads of the mounting substrate has been pre-coated is melted by using a reflow furnace or the like. After that, the solder is solidified so that the solder bumps of the chip and the connection pads of the mounting substrate are electrically and mechanically bonded to each other. Then, the flux is cleaned off as required. Then, to improve reliability of the connection between the solder bumps of the chip and the connection pads of the mounting substrate, an underfill resin may be filled in between the chip and the mounting substrate followed by hardening of the underfill resin.

The flip chip bonding allows high-density packaging and is therefore widely employed for packaging of electronic components used in computers, and so on. The flip chip bonding allows the connection pads of the chip to be electrically connected to the connection pads of the mounting substrate via fine bumps. Therefore, by establishing electrical connection between the chip and the mounting substrate in a piezoelectric resonant filter through the use of the flip chip bonding, an extra parasitic inductance occurring between connection pads of the chip and the mounting substrate can be significantly reduced.

In prior art, as a method for establishing electrical connection between the chip and the mounting substrate in a surface acoustic wave filter, the following method has been proposed as described in Hiromi Yatsuda et al., "Miniaturized SAW Filters Using a Flip-Chip Technique", IEEE TRANSACTIONS ON ULTRASONICS, FERROELECTRICS, AND FREQUENCY CONTROL, VOL. 43, NO. 1, pp. 125–130, JANUARY 1996. In this method, first, metal bumps made of Au, for example, are formed on the connection pads of the chip using a conventional wire bonding machine. At this time, as required, the chip may be heated by using a heating stage to accelerate bonding of the metal bumps to the connection pads. The chip is then positioned and mounted on the mounting substrate such that the metal bumps of the chip face the connection pads of the mounting substrate. Then, the chip is subjected to an ultrasonic wave under pressure to bond the metal bumps to the connection pads of the mounting substrate. At this time, the chip may be heated to thereby accelerate the bonding. In this method, the metal bumps are bonded to the connection pads of the mounting substrate by interdiffusion between the metal atoms that make those bumps and connection pads in a solid phase.

As a method for establishing electrical connection between the chip and the mounting substrate, the technique of directly connecting the solder bumps of the chip to the connection pads of the mounting substrate by flip chip bonding has been widely employed because of its high reliability. However, from the viewpoint of friendliness to the environment, it is not preferable to use solder that contains lead.

Moreover, when this method is employed, in the step of melting the solder by heating, the flux can be scattered over the device surfaces of the chip to thereby contaminate the device surfaces. For this reason, there is typically provided a cleaning step for removing flux residues after the solder bumps of the chip have been bonded to the connection pads of the mounting substrate. Nevertheless, after the cleaning step, flux residues and impurities such as the flux melted in the cleaning solution may remain sticking to the device surface.

In a thin-film piezoelectric resonator, bulk waves occur in the piezoelectric thin film by application of a high frequency voltage to the two electrodes disposed on both surfaces of the piezoelectric thin film. The resonant state and the anti-resonant state of the thin-film piezoelectric resonator depend on the thickness of the piezoelectric thin film. Therefore, in a thin-film piezoelectric resonator, even a slight contamination of the surface of the device or the thin-film piezoelectric resonator would result in variations in the resonant frequency and the anti-resonant frequency of the thin-film piezoelectric resonator due to a mass loading effect. Any shifts of the resonant frequency and anti-resonant frequency of the resonator in the filter from the originally designed values would cause the center frequency of the passband of the filter to be shifted from its originally designed value. Furthermore, any shifts of resonant frequency and anti-resonant frequency of the resonator in the filter from the originally designed values would probably increase the insertion loss of the filter.

To prevent such contamination of the surface of the thin-film piezoelectric resonator as mentioned above, it is conceivable to provide an acoustic mirror on the resonator to protect it, as described in U.S. Pat. No. 5,872,493. In this case, however, the acoustic mirror made up of a plurality of layers need to be formed with high precision in thickness, which makes the manufacture of the thin-film piezoelectric resonator difficult.

To perform flip chip bonding without solder, a method is known in which gold bumps provided on the chip are electrically connected to the connection pads of the mounting substrate by using a conductive paste or an anisotropic conductive sheet. However, the method employing the conductive paste leads to a lower reliability of the electrical connection between the bumps and the connection pads, or requires a long time for drying the conductive paste. On the other hand, in the method employing the anisotropic conductive sheet, the anisotropic conductive sheet contacts the surface of the chip on which devices are mounted. Therefore, this method is not preferable for use for mounting the chip in piezoelectric resonant filters.

As described above, in the prior art, piezoelectric resonant filters incorporating a thin-film piezoelectric resonator have suffered from problems such as occurrence of shifts or degradation of the electrical properties of the filter related to mounting of the chip onto the mounting substrate, and a poor reliability of the electrical connection between the chip and the mounting substrate.

OBJECT AND SUMMARY OF THE INVENTION

It is therefore an object of the invention to provide a piezoelectric resonant filter comprising a chip with a thin-film piezoelectric resonator and a mounting substrate having the chip mounted thereon, which makes it possible to prevent a shift or degradation in the electrical properties of the filter attributable to mounting of a chip onto the mounting substrate and to achieve improved reliability of electrical connection between the chip and the mounting substrate, and also to provide a duplexer that includes this piezoelectric resonant filter and methods of manufacturing such filters and duplexers.

A piezoelectric resonant filter of the invention is a filter including a thin-film piezoelectric resonator, the thin-film piezoelectric resonator having a piezoelectric thin film with a piezoelectric property and two exciting electrodes disposed on both surfaces of the piezoelectric thin film to apply an exciting voltage to the piezoelectric thin film. The piezoelectric resonant filter comprises a chip having the thin-film piezoelectric resonator, and a mounting substrate on which the chip is mounted.

The chip has a plurality of chip-side conductors made of a metal, the chip-side conductors being connected to the exciting electrodes or constituting the exciting electrodes. The mounting substrate has a plurality of substrate-side conductors that are made of a metal and to be electrically connected to the chip-side conductors. The piezoelectric resonant filter further comprises a plurality of bumps provided on the chip-side conductors or on the substrate-side conductors. The chip is mounted on the mounting substrate by flip chip bonding such that the chip-side conductors and the substrate-side conductors are electrically and mechanically connected to each other via the bumps. The bumps provided on the chip-side conductors are bonded to the substrate-side conductors, or the bumps provided on the substrate-side conductors are bonded to the chip-side conductors, by interdiffusion between atoms of the respective metals of which the bumps and the conductors are made, without involving melting of the respective metals of which the bumps and the conductors are made.

In the piezoelectric resonant filter of the invention, the chip having the thin-film piezoelectric resonator is mounted on the mounting substrate by flip chip bonding. Therefore, no extra parasitic inductance will develop when the chip is mounted. Furthermore, in the piezoelectric resonant filter of the invention, the bumps provided on the chip-side conductors are bonded to the substrate-side conductors, or the bumps provided on the substrate-side conductors are bonded to the chip-side conductors, by interdiffusion between atoms of the respective metals of which the bumps and the conductors are made, without involving melting of the respective metals of which the bumps and the conductors are made. Accordingly, the thin-film piezoelectric resonator cannot be contaminated by any flux residue or the like.

In the piezoelectric resonant filter of the invention, the bumps may be made of gold.

In the piezoelectric resonant filter of the invention, the chip may have a conductor layer disposed between each of the chip-side conductors and each of the bumps provided on the chip-side conductors, the conductor layer being made of a metal different from the respective metals of which the bumps and the conductors are made. In this case, the conductor layer may be made of titanium or nickel.

In the piezoelectric resonant filter of the invention, the chip may include a series resonator and a parallel resonator each formed of the thin film piezoelectric resonator, the series resonator and the parallel resonator constituting a ladder filter circuit.

A method of manufacturing the piezoelectric resonant filter of the invention comprises the steps of: fabricating the chip; fabricating the mounting substrate; forming a plurality of bumps on the chip-side conductors or on the substrate-side conductors; and mounting the chip on the mounting substrate by flip chip bonding such that the chip-side conductors and the substrate-side conductors are electrically and mechanically connected to each other via the bumps. In the step of mounting, the bumps provided on the chip-side conductors are bonded to the substrate-side conductors, or the bumps provided on the substrate-side conductors are bonded to the chip-side conductors, by interdiffusion between atoms of the respective metals of which the bumps and the conductors are made, without involving melting of the respective metals of which the bumps and the conductors are made.

In the method of manufacturing the piezoelectric resonant of the invention, in the step of mounting, an ultrasonic wave may be applied to the bumps to accelerate the interdiffusion between the atoms of the respective metals.

A duplexer of the invention is connected to an antenna, and comprises a first filter that allows a transmission signal to pass therethrough and interrupts a reception signal, and a second filter that allows the reception signal to pass therethrough and interrupts the transmission signal. At least one of the first and second filters of the duplexer is the piezoelectric resonant filter of the invention.

A method of manufacturing the duplexer of the invention comprises the step of manufacturing the first filter and the step of manufacturing the second filter. At least one of the steps of manufacturing the first filter and manufacturing the second filter includes the step of manufacturing the piezoelectric resonant filter. The step of manufacturing the piezoelectric resonant filter includes the steps of: fabricating the chip of the piezoelectric resonant filter; fabricating the mounting substrate; forming a plurality of bumps on the chip-side conductors or on the substrate-side conductors; and mounting the chip on the mounting substrate by flip chip bonding such that the chip-side conductors and the substrate-side conductors are electrically and mechanically connected to each other via the bumps. In the step of mounting, the bumps provided on the chip-side-conductors are bonded to the substrate-side conductors, or the bumps provided on the substrate-side conductors are bonded to the chip-side conductors, by interdiffusion between atoms of the respective metals of which the bumps and the conductors are made, without involving melting of the respective metals of which the bumps and the conductors are made.

In the method of manufacturing the duplexer of the invention, in the step of mounting, an ultrasonic wave may be applied to the bumps to accelerate the interdiffusion between the atoms of the metals.

Other objects, features and advantages of the invention will become sufficiently clear from the following description.

DETAILED DESCRIPTION OF THE PREFERRED EMBODIMENTS

Embodiments of the invention will now be described in detail with reference to the drawings.

[First Embodiment]

Figure 1:
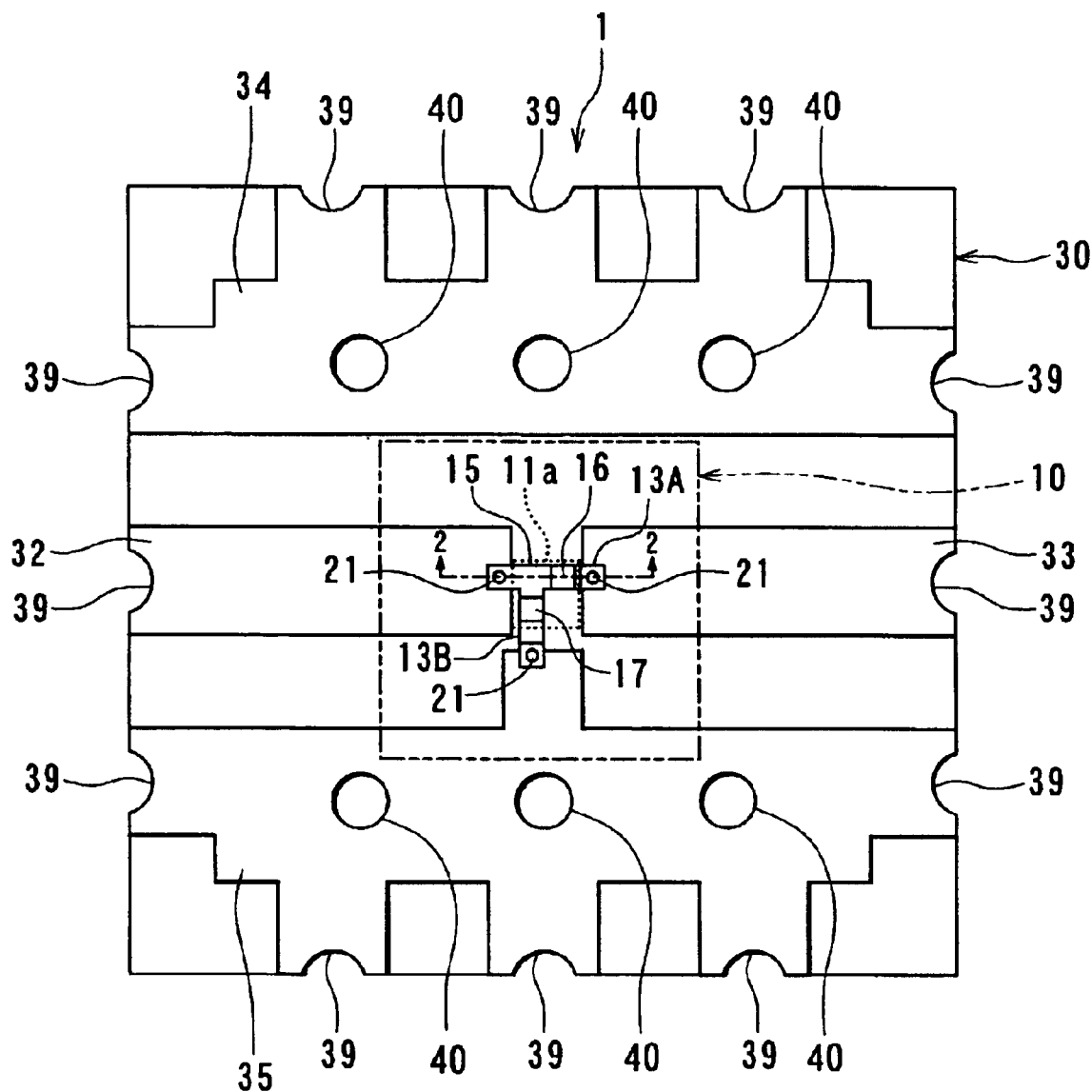
FIG. 1 is a top view of a piezoelectric resonant filter according to a first embodiment of the invention.
Figure 2:
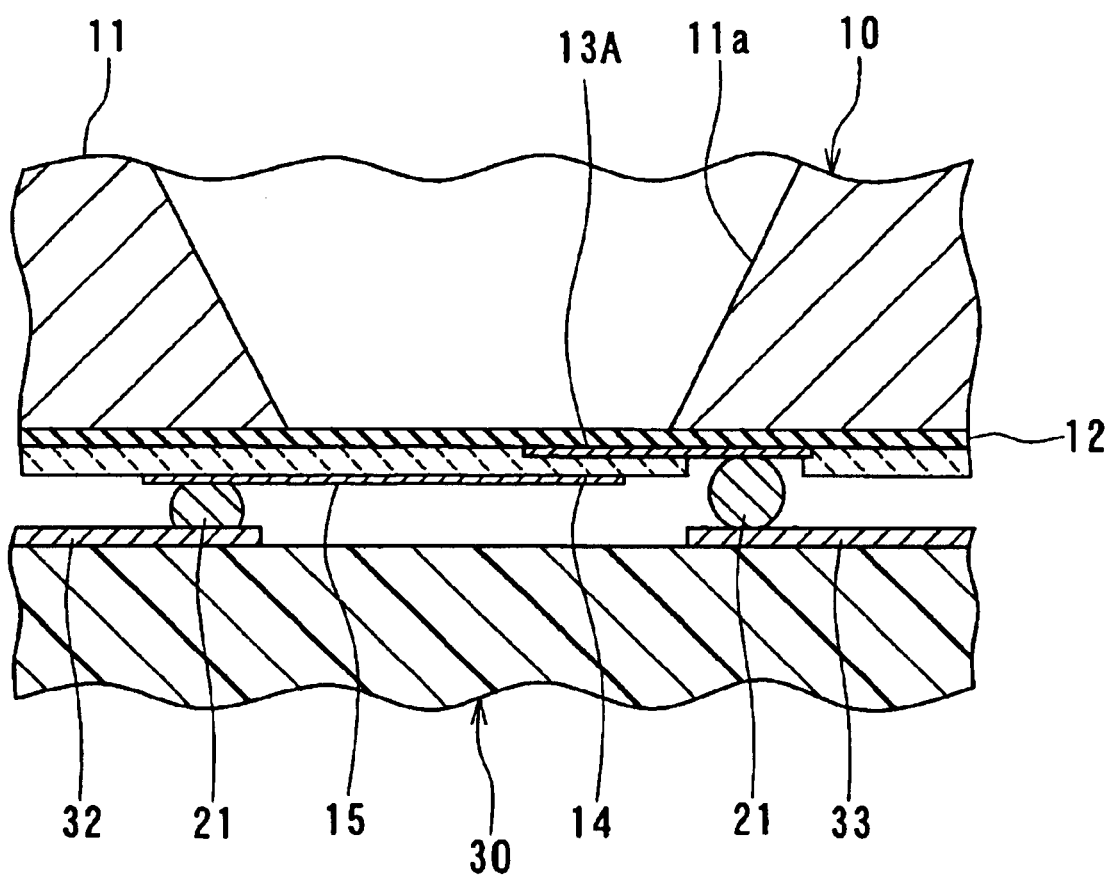
FIG. 2 is an enlarged cross-sectional view taken along line 2—2 of FIG. 1.

First, reference is made to FIG. 1 and FIG. 2 to describe a configuration of a piezoelectric resonant filter according to a first embodiment of the invention. FIG. 1 is a top view of the piezoelectric resonant filter according to the embodiment, and FIG. 2 is an enlarged cross-sectional view taken along line 2—2 of FIG. 1.

The piezoelectric resonant filter 1 according to the present embodiment has a filter circuit including a plurality of thin-film piezoelectric resonators, and is packaged. As shown in FIG. 1, the piezoelectric resonant filter 1 comprises a chip 10 having a plurality of thin-film piezoelectric resonators and a mounting substrate 30 on which the chip 10 is mounted. FIG. 1 omits a base body, a barrier layer, and a piezoelectric thin film of the chip 10, which will be described later.

As shown in FIG. 2, the chip 10 is mounted on the mounting substrate 30 by flip chip bonding which is a kind of face-down bonding. There are provided a plurality of bumps 21 serving as projected connection electrodes on one of surfaces of the chip 10 (the bottom surface in FIG. 2). The bumps 21 are formed of metal. On one of surfaces of the mounting substrate 30 (the top surface in FIG. 2), there are provided signal conductors 32 and 33, and ground conductors 34 and 35 (see FIG. 1), each formed into predetermined patterns. The conductors 32, 33, 34, and 35 are formed of metal. The chip 10 is disposed such that the one of its surfaces having the bumps 21 provided thereon is opposed to the one of the surfaces of the mounting substrate 30, to allow the bumps 21 to be electrically and mechanically connected to the predetermined positions of the conductors 32, 33, and 35. The conductors 32, 33, and 35 correspond to the substrate-side conductors of the invention.

Figure 3:
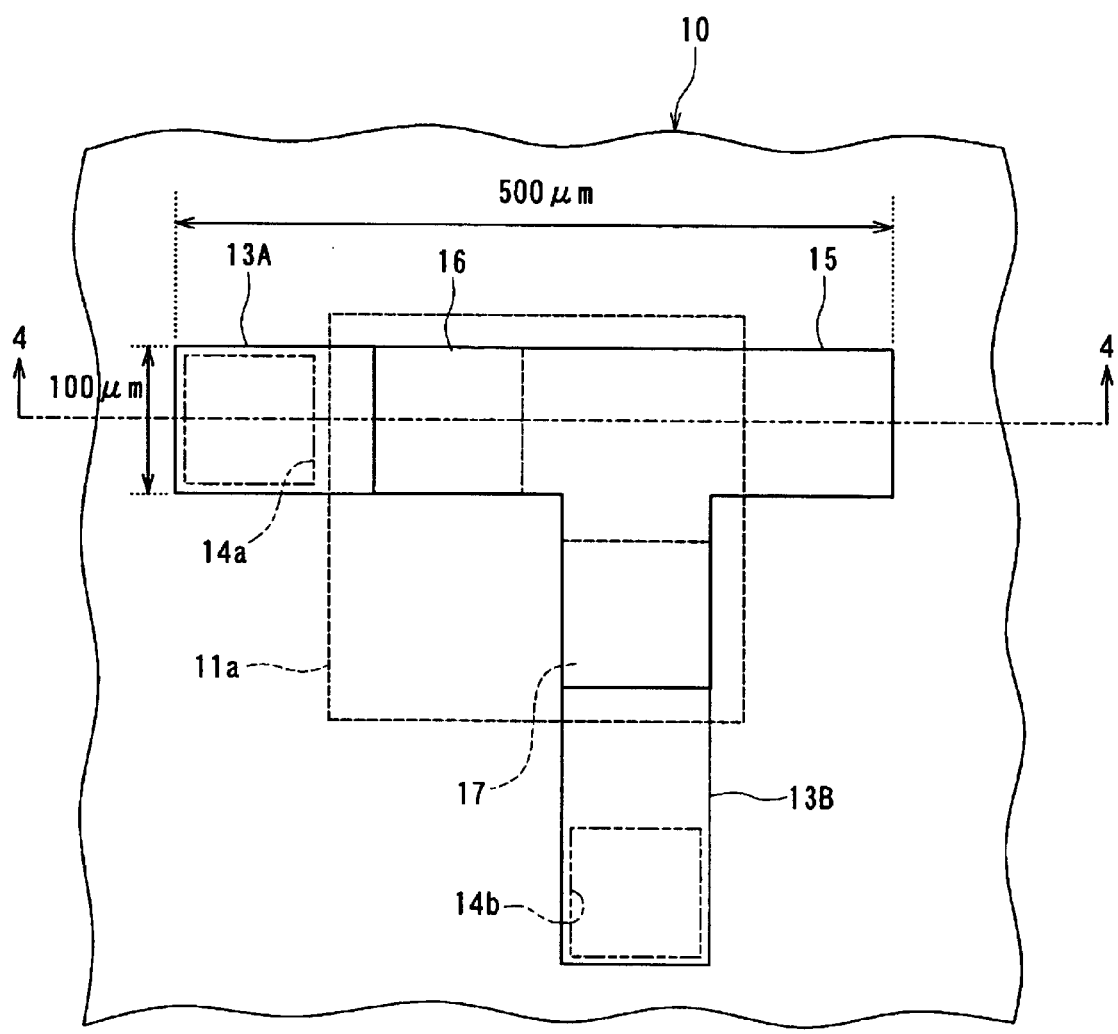
FIG. 3 is a top view illustrating a main part of the chip of FIG. 1 before formation of bumps thereon.
Figure 4:
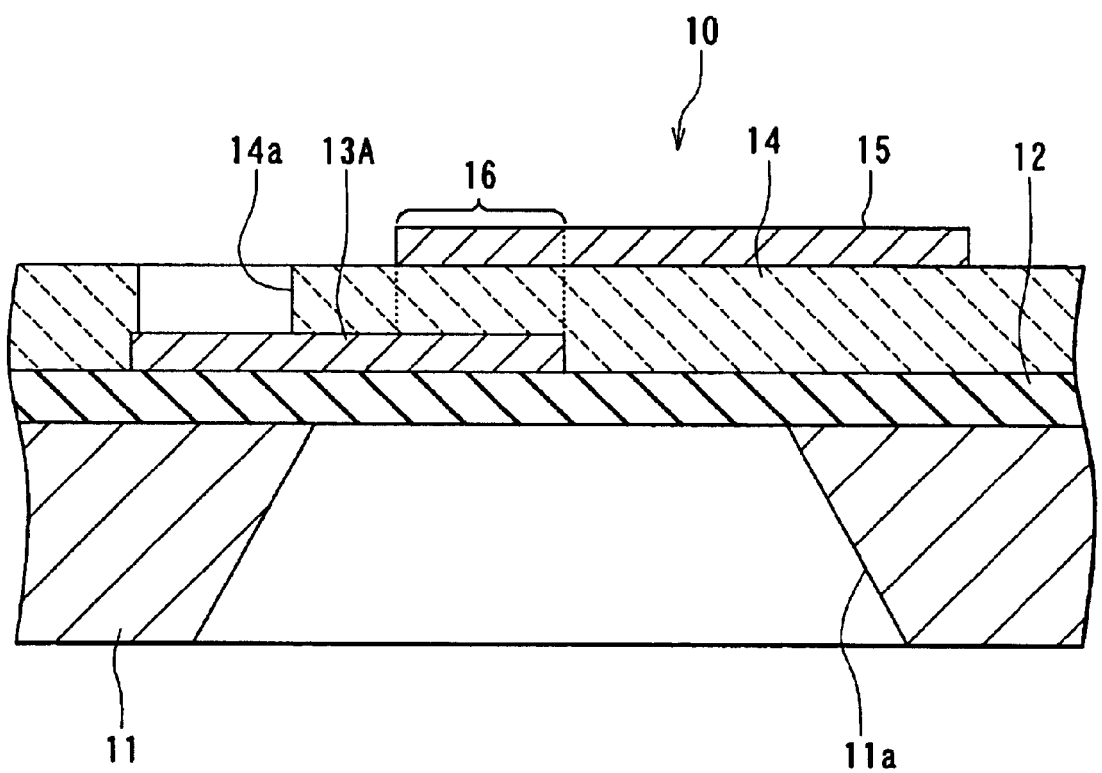
FIG. 4 is a cross-sectional view taken along line 4—4 of FIG. 3.

Next, a configuration of the chip 10 will be described in detail with reference to FIG. 3 through FIG. 7. FIG. 3 is a top view illustrating a main part of the chip 10 before formation of the bumps 21 thereon, and FIG. 4 is a cross-sectional view taken along line 4—4 of FIG. 3. FIG. 4 is drawn in such a manner that the vertical dimension, i.e., the thickness, appears larger than the horizontal dimension. For example, as viewed from above, the chip 10 is 2 mm in length and 2 mm in width.

The chip 10 comprises a base body 11, a barrier layer 12 disposed on the base body 11, lower electrodes 13A and 13B disposed on the barrier layer 12, a piezoelectric thin film 14 disposed on the lower electrodes 13A and 13B, and an upper electrode 15 disposed on the piezoelectric thin film 14.

As shown in FIG. 3 and FIG. 4, the base body 11 has a cavity 11a that forms an opening on a side opposite to the side on which the piezoelectric thin film 14 and the electrodes 13A, 13B, 15 are formed. As shown in FIG. 3, the cavity 11a is rectangular in shape as viewed from above. For example, a silicon (Si) substrate is used as the base body 11.

The barrier layer 12 is an insulating layer for separating the base body 11 from the lower electrodes 13A and 13B, so that the lower electrodes 13A and 13B can be disposed on an area corresponding to the cavity 11a of the base body 11. For example, silicon nitride ($SiN_x$) is used as the materiel of the barrier layer 12. The barrier layer 12 may be made of the same material as that for the base body 11.

The piezoelectric thin film 14 is a thin film having a piezoelectric property. The piezoelectric thin film 14 is made of zinc oxide (ZnO) or aluminum nitride (AlN), for example. Each of the lower electrodes 13A, 13B and the upper electrode 15 is mainly composed of metal. For example, the lower electrodes 13A, 13B are made of platinum (Pt). For example, the upper electrode 15 is made of aluminum (Al). The planar shape of each of the lower electrodes 13A, 13B is rectangular that is long in one direction. The planar shape of the upper electrode 15 is T-shaped. For example, these electrodes 13A, 13B, and 15 are each 100 μm in width.

A portion of the piezoelectric thin film 14 that is sandwiched between the lower electrode 13A or 13B and the upper electrode 15 serves as a resonant portion. The planar shape of the resonant portion may be a square or any other shapes. That is, the planar shape of the resonant portion may be a rectangle of which four sides have any given lengths, a polygon other than a rectangle each side of which has any given length, or a shape having a curved portion, such as a circle or an ellipse.

As viewed from above as shown in FIG. 3, the right-hand end of the lower electrode 13A is located within the area corresponding to the cavity 11a, while the left-hand end of the lower electrode 13A is located outside the area corresponding to the cavity 11a. On the other hand, in FIG. 3, the upper end of the lower electrode 13B is located within the area corresponding to the cavity 11a, while the lower end of the lower electrode 13B is located outside the area corresponding to the cavity 11a. Furthermore, the left-hand end and the lower end of the upper electrode 15 are located within the area corresponding to the cavity 11a, while the right-hand end of the upper electrode 15 is located outside the area corresponding to the cavity 11a.

A portion of the lower electrode 13A near the right-hand end thereof and a portion of the upper electrode 15 near the left-hand end thereof are opposed to each other with the piezoelectric thin film 14 in between. Then, the overlapping portions of the lower electrode 13A and the upper electrode 15 and a portion of the piezoelectric thin film 14 located therebetween make up a series resonator 16. The series resonator 16 is a thin-film piezoelectric resonator that includes the piezoelectric thin film 14 having a piezoelectric property, and two exciting electrodes, i.e., the lower electrode 13A and the upper electrode 15, disposed on the surfaces of the piezoelectric thin film 14, for applying an exciting voltage to the piezoelectric thin film 14. As viewed from above, the length from the left-hand end of the lower electrode 13A to the right-hand end of the upper electrode 15 is 500 μm, for example, and the series resonator 16 is 100 μm in length and 100 μm in width, for example.

A portion of the lower electrode 13B near the upper end thereof and a portion of the upper electrode 15 near the lower end thereof are opposed to each other with the piezoelectric thin film 14 in between. Then, the overlapping portions of the lower electrode 13B and the upper electrode 15 and a portion of the piezoelectric thin film 14 located therebetween make up a parallel resonator 17. The parallel resonator 17 is a thin-film piezoelectric resonator that includes the piezoelectric thin film 14 having a piezoelectric property, and two exciting electrodes, i.e., the lower electrode 13B and the upper electrode 15, disposed on the surfaces of the piezoelectric thin film 14, for applying an exciting voltage to the piezoelectric thin film 14. As viewed from above, the parallel resonator 17 is 100 μm in length and 100 μm in width, for example.

In the piezoelectric thin film 14, there are formed through-holes 14a and 14b at a position corresponding to the portion of the lower electrode 13A near the left-hand end thereof and at a position corresponding to the portion of the lower electrode 13B near the lower end thereof in FIG. 3, respectively.

Figure 5:
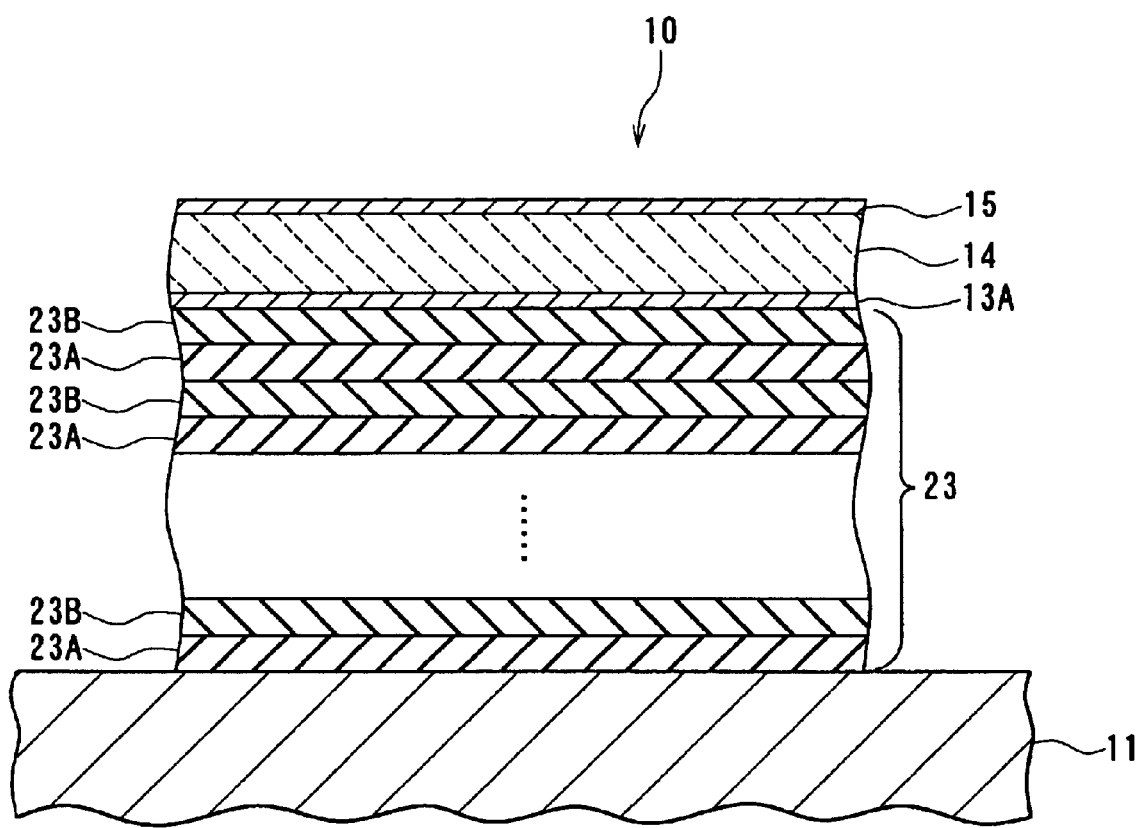
FIG. 5 is a cross-sectional view illustrating an example of a configuration of the chip of the first embodiment of the invention.
Figure 6:
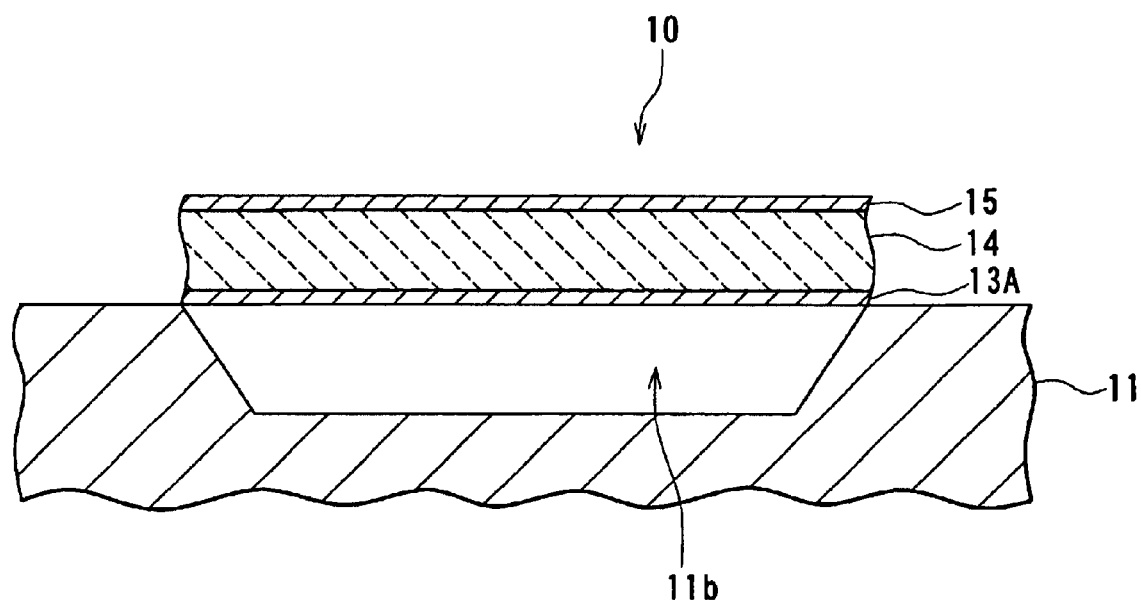
FIG. 6 is a cross-sectional view illustrating another example of the configuration of the chip of the first embodiment of the invention.

Now, reference is made to FIG. 5 and FIG. 6 to describe another example of the configuration of the chip 10. In the example shown in FIG. 5, the chip 10 comprises the base body 11, a multi-layered acoustic film 23 disposed on the base body 11, the lower electrodes 13A and 13B (only 13A is shown in FIG. 5) disposed on the multi-layered acoustic film 23, the piezoelectric thin film 14 disposed on the lower electrodes 13A and 13B, and the upper electrode 15 disposed on the piezoelectric thin film 14. For example, the multi-layered acoustic film 23 is formed by alternately stacking a layer 23A made of a material having a high acoustic impedance such as aluminum nitride and a layer 23B made of a material having a low acoustic impedance such as silicon oxide. In the example shown in FIG. 5, no cavity is provided in the base body 11.

In the example shown in FIG. 6, the chip 10 comprises the base body 11, the lower electrodes 13A and 13B (only 13A is shown in FIG. 6) disposed on the base body 11, the piezoelectric thin film 14 disposed on the lower electrodes 13A and 13B, and the upper electrode 15 disposed on the piezoelectric thin film 14. There is formed a recess in the top surface of the base body 11. The lower electrodes 13A, 13B are disposed over the recess of the base body 11 so that a gap 11b is formed between the base body 11 and the lower electrodes 13A, 13B.

Figure 7:
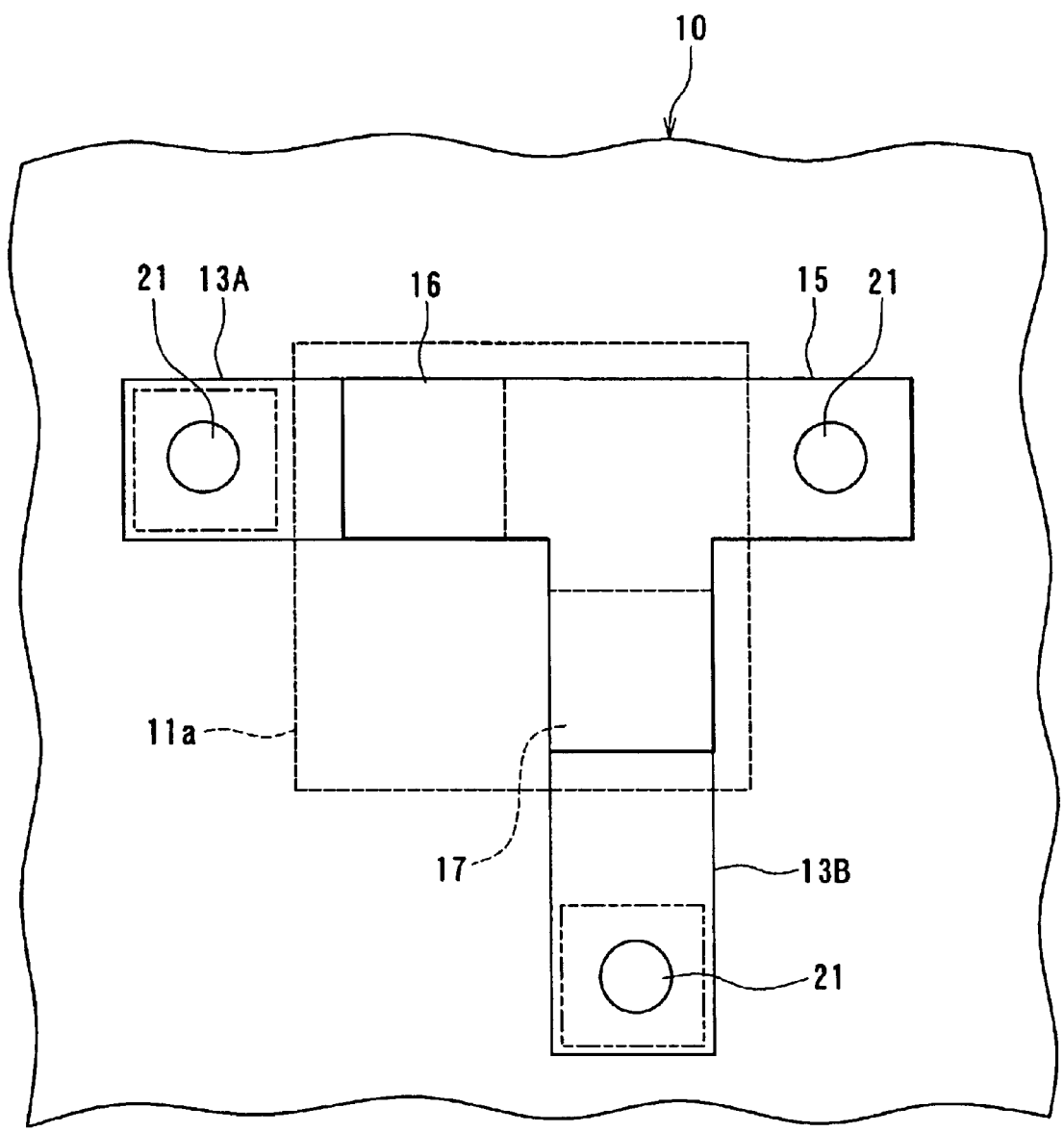
FIG. 7 is a top view illustrating the main part of the chip of FIG. 1 after formation of the bumps thereon.

FIG. 7 is a top view illustrating the main part of the chip 10 after formation of the bumps 21 thereon. As shown in FIG. 7, the bumps 21 are formed at the portion of the lower electrode 13A near the left-hand end thereof, the portion of the lower electrode 13B near the lower end thereof, and at the portion of the upper electrode 15 near the right-hand end thereof. For example, the portions of the electrodes 13A, 13B, and 15, at which the bumps 21 are formed, each have a thickness of about 5 μm. The portions of the electrodes 13A, 13B, and 15 where the bumps 21 are formed correspond to the chip-side conductors of the invention.

Figure 8:
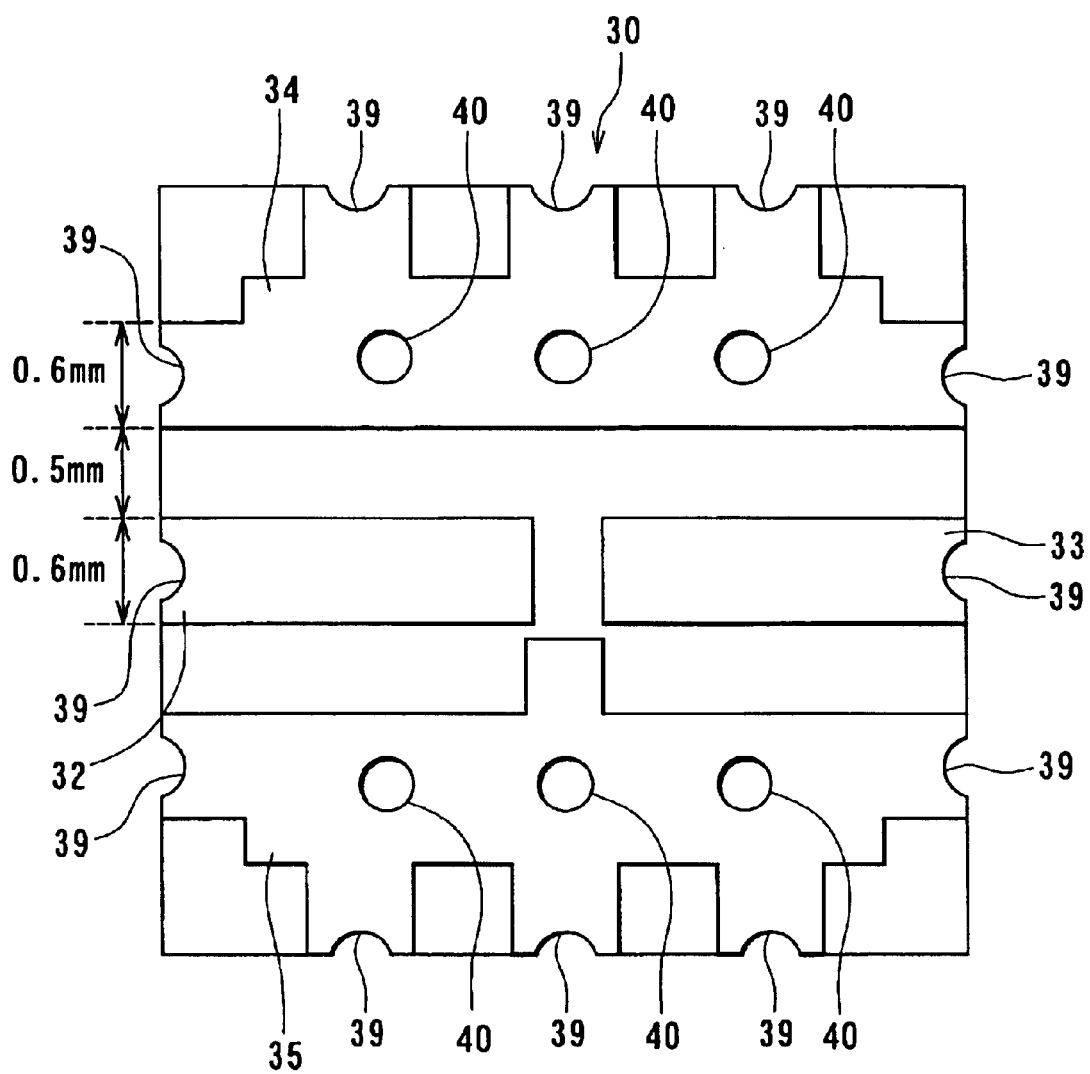
FIG. 8 is a top view of a mounting substrate of the first embodiment of the invention.
Figure 9:
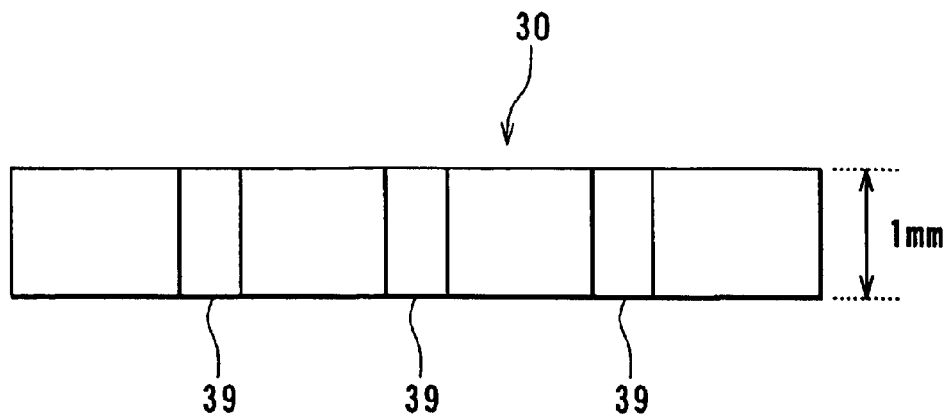
FIG. 9 is a side view of the mounting substrate as viewed from the lower side of FIG. 8.
Figure 10:
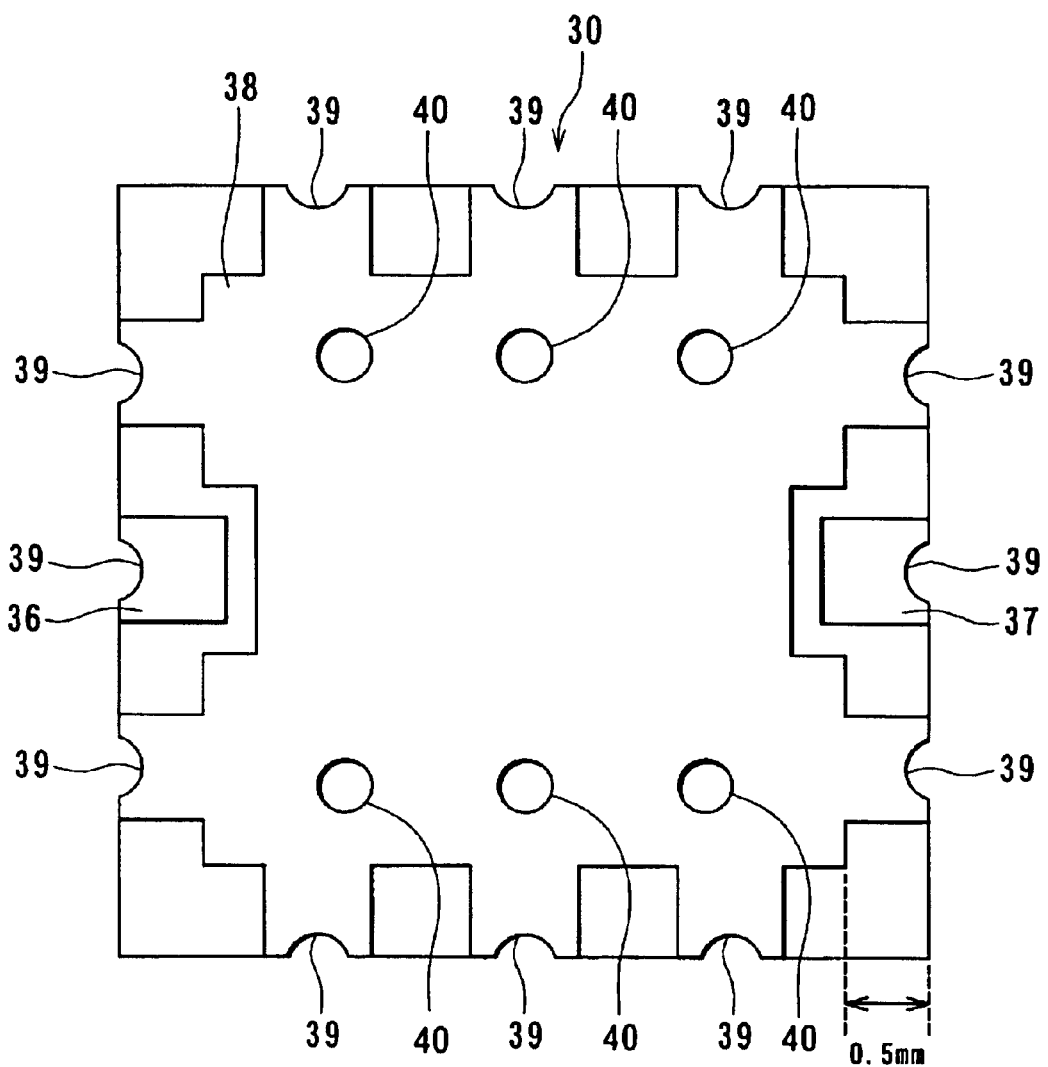
FIG. 10 is a bottom view of the mounting substrate of the first embodiment of the invention.

Next, a configuration of the mounting substrate 30 will be described in detail with reference to FIG. 8 through FIG. 10. FIG. 8 is a top view of the mounting substrate 30; FIG. 9 is a side view of the mounting substrate 30 as viewed from the lower side of FIG. 8; and FIG. 10 is a bottom view of the mounting substrate 30. For example, the mounting substrate 30 is 5 mm in length, 5 mm in width, and 1 mm in thickness. The mounting substrate 30 is made of glass epoxy, for example.

On the top surface of the mounting substrate 30, there are provided the signal conductors 32, 33 and the ground conductors 34, 35. The signal conductor 32 extends from a center portion of the top surface of the mounting substrate 30 to the left-hand end thereof. The signal conductor 33 extends from the center portion of the top surface of the mounting substrate 30 to the right-hand end thereof. On the top surface of the mounting substrate 30, the right-hand end of the signal conductor 32 and the left-hand end of the signal conductor 33 are opposed to each other with a predetermined spacing between each other. The ground conductor 34 is disposed on the upper side of the signal conductors 32 and 33 in FIG. 8, at a predetermined distance from each of the signal conductors 32 and 33. The ground conductor 35 is disposed on the lower side of the signal conductors 32 and 33 in FIG. 8, at a predetermined distance from each of the signal conductors 32 and 33. A portion of the ground conductor 35 is projected toward the area where the right-hand end of the signal conductor 32 and the left-hand end of the signal conductor 33 are opposed to each other.

At the bottom surface of the mounting substrate 30, a signal conductor 36 is provided near the left-hand end thereof, a signal conductor 37 is provided near the right-hand end thereof, and a ground conductor 38 is provided to extend over a large area. The signal conductors 36 and 37 are each separated from the ground conductor 38 by a predetermined distance.

On each of the four sides of the mounting substrate 30, there are provided three end-face through-holes 39. The signal conductor 32 is electrically connected to the signal conductor 36 via one of the end-face through-holes 39. Likewise, the signal conductor 33 is electrically connected to the signal conductor 37 via another end-face through-hole 39.

Furthermore, there are provided three through-holes 40 in the area where the ground conductor 34 is provided, while another three through-holes 40 are provided in the area where the ground conductor 35 is provided. The ground conductor 34 is connected to the ground conductor 38 via three through-holes 40 and five end-face through-holes 39. Likewise, the ground conductor 35 is connected to the ground conductor 38 via three through-holes 40 and five end-face through-holes 39.

For example, as shown in FIG. 8, the signal conductors 32 and 33 are 0.6 mm in width. For example, as shown in FIG. 8 and FIG. 10, the portions of the ground conductors 34, 35, and 38 that are connected to the end-face through-holes 39 are each 0.5 mm in length and 0.6 mm in width. The distance between the ground conductor 34 and the signal conductors 32, 33, and the distance between the ground conductor 35 and the signal conductors 32, 33 are each 0.5 mm, for example. For example, the end-face through-holes 39 are 0.4 mm in diameter and 1.27 mm in pitch. For example, the through-holes 40 are 0.3 mm in diameter and 0.8 mm in pitch.

The signal conductors 32, 33, and the ground conductors 34, 35, 38 are each formed by stacking a nickel (Ni) layer and a gold (Au) layer in this order on a copper (Cu) layer. In this case, the total thickness of the copper, nickel and gold layers is 45 μm, for example.

In the foregoing description, the bumps 21 are formed on the electrodes 13A, 13B, and 15 of the chip 10; however, the bumps 21 may be formed on conductor layers connected to the electrodes 13A, 13B, and 15. In this case, the conductor layers correspond to the chip-side conductors of the invention. The bumps 21 may also be formed on the conductors 32, 33, and 35 of the mounting substrate 30. In this case, the bumps 21 are electrically and mechanically connected to the electrodes 13A, 13B, and 15 of the chip 10, or to the conductor layers connected thereto.

Figure 11:
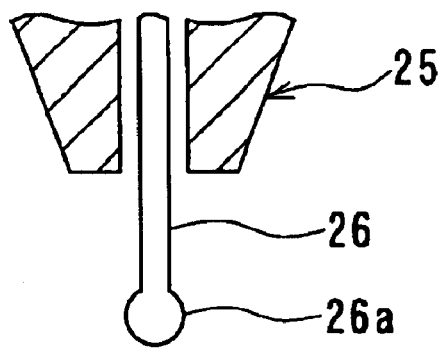
FIG. 11 is an explanatory view for explaining an example of a method of forming the bumps in the first embodiment of the invention.
Figure 11:
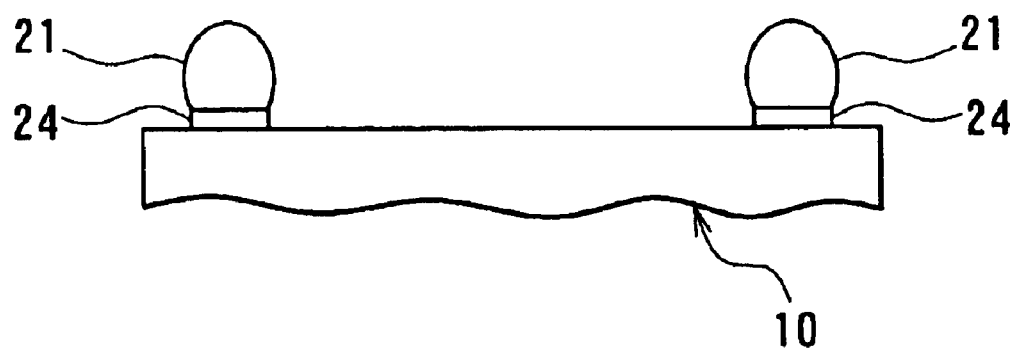
Figure 12:
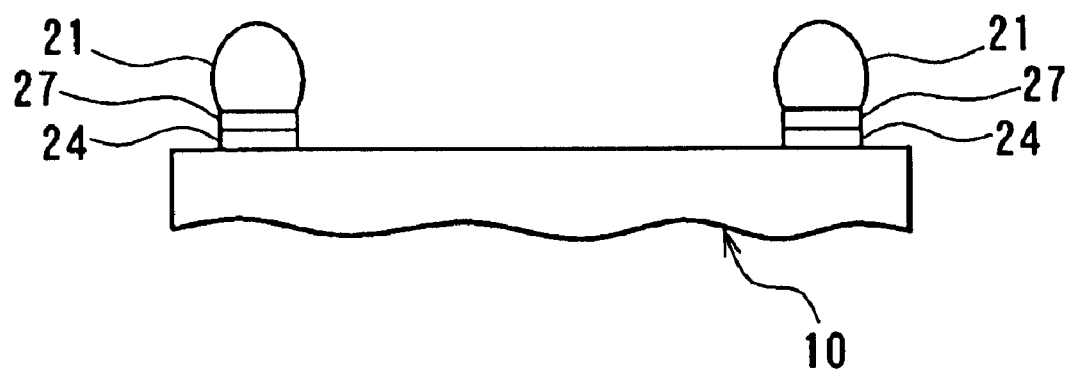
FIG. 12 is an explanatory view for explaining another example of a method of forming the bumps in the first embodiment of the invention.
Figure 13:
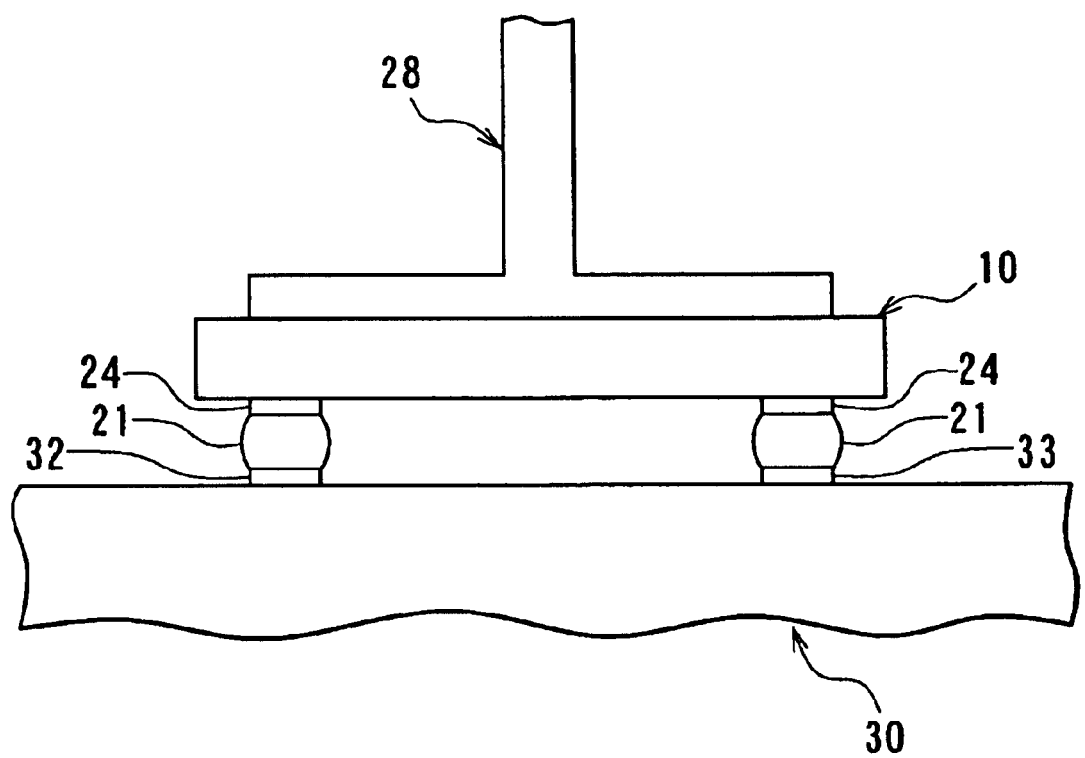
FIG. 13 is an explanatory view for explaining the step of mounting the chip in the first embodiment of the invention.

Reference is now made to FIG. 11 through FIG. 13 to describe a method of manufacturing the piezoelectric resonant filter 1 according to the present embodiment. The method includes the steps of fabricating the chip 10 in the aforementioned configuration, fabricating the mounting substrate 30 in the aforementioned configuration, forming a plurality of bumps 21 on the chip 10 or on the mounting substrate 30, and mounting the chip 10 on the mounting substrate 30 by flip chip bonding.

Now, the step of fabricating the chip 10 and the step of forming the bumps 21 will be described, taking as an example the case where the bumps 21 are provided on the chip 10. In the step of fabricating the chip 10, the components of the chip 10 other than the base body 11 are stacked one by one on the base body 11. Referring to FIG. 11, an example of a method of forming the bumps 21 will be described. In this example, first, the chip 10 before formation of the bumps 21 thereon is secured to a work stage (not shown) such that the surface of the base body 11 on which the piezoelectric thin film 14 and the electrodes 13A, 13B, and 15 are arranged faces upward. The work stage may be heated as necessary. In the case of heating the work stage, the work stage may be 120° C. in temperature, for example. Then, the bumps 21 are formed by using, for example, an ultrasonic bump bonder 25. The bumps 21 are formed on conductor layers 24 made of metal, which are provided on the chip 10. The conductor layers 24 are connected to the electrodes 13A, 13B, 15, or constitute the electrodes 13A, 13B, 15. The ultrasonic bump bonder 25 is supplied with a metal wire 26 made of a material for forming the bumps 21. There is formed a ball 26a at an end of the metal wire 26. The ultrasonic bump bonder 25 allows the ball 26a to be bonded to the conductor layers 24 by using a load and an ultrasonic wave, and then to be disconnected from the metal wire 26. The bumps 21 are thereby formed on the conductor layers 24. For example, the bumps 21 are made of gold (Au). For example, the bumps 21 are about 60 μm in diameter.

In the case of forming the bumps 21 on the mounting substrate 30, the bumps 21 are formed in the same way as above.

As shown in FIG. 12, between each of the conductor layers 24 and each of the bumps 21 there may be provided a conductor layer 27 that is made of a metal different from the respective metals of which the conductor layers 24 and the bumps 21 are made. The conductor layers 27 are formed on the conductor layers 24 by a thin film forming technique such as vapor deposition or sputtering before formation of the bumps 21. Then, the bumps 21 are formed on the conductor layers 27. The conductor layers 27 serve to prevent an excess interdiffusion between the metal atoms of the conductor layers 24 and the bumps 21. For example, the conductor layers 27 are made of titanium (Ti) or nickel (Ni). The thickness of the conductor layers 27 is, e.g., 3 μm, but not limited thereto.

Next, the step of mounting the chip 10 on the mounting substrate 30 will be described, taking as an example the case where the bumps 21 are provided on the chip 10. As shown in FIG. 1 and FIG. 2, the chip 10 is placed on the top surface of the mounting substrate 30 such that the surface of the chip 10 on which the bumps 21 are formed faces downward, and then mounted on the mounting substrate 30 by flip chip bonding. At this time, the lower electrode 13A is electrically connected to the signal conductor 33 via a bump 21. The lower electrode 13B is electrically connected to the ground conductor 35 via a bump 21. The upper electrode 15 is electrically connected to the signal conductor 32 via a bump 21.

Now, the step of mounting the chip 10 on the mounting substrate 30 will be described in detail with reference to FIG. 13. First, the mounting substrate 30 is secured to a work stage (not shown) such that the surface of the mounting substrate 30 on which the conductors 32, 33, 34, and 35 are formed faces upward. The work stage may be heated as necessary. In the case of heating the work stage, the work stage may be 120° C. in temperature, for example. Then, an ultrasonic flip chip bonding tool 28 is used to vacuum and hold the chip 10 such that the surface of the chip 10 on which the bumps 21 are formed faces downward. The tool 28 includes an ultrasonic oscillator so that an ultrasonic wave generated by the ultrasonic oscillator is applied to the chip 10.

Subsequently, the bumps 21 of the chip 10 are aligned and brought into contact with the conductors 32, 33, and 35 of the mounting substrate 30. The tool 28 then applies a load to the chip 10 to push the bumps 21 against the conductors 32, 33, and 35. The tool 28 also applies an ultrasonic wave to the chip 10 to thereby apply the ultrasonic wave to the bumps 21. The ultrasonic wave to be applied to the chip 10 may travel in a perpendicular direction, in a parallel direction or in both perpendicular and parallel directions with respect to the surface of the chip 10 on which the bumps 21 are formed. In this way, the load, heat, and ultrasonic wave are applied to the bumps 21 and the conductors 32, 33, and 35. These operations allow the bumps 21 to be bonded to the conductors 32, 33, 35 by interdiffusion between atoms, in a solid phase, of the respective metals of which the bumps and the conductors are made, without involving melting of the respective metals of which the bumps and the conductors are made. Even in the case of applying heat to the bumps 21 and the conductors 32, 33 and 35, bonding of the bumps 21 to the conductors 32, 33 and 35 is performed at a temperature lower than the melting point of the metal of which the bumps 21 are made. The ultrasonic wave accelerates the interdiffusion between the atoms of the respective metals of which the bumps 21 and the conductors 32, 33, 35 are made. The bumps 21 and the conductors 32, 33, 35 may be subjected to only a load and heat, or only to a load and an ultrasonic wave.

The step of mounting the chip 10 in the case where the bumps 21 are provided on the mounting substrate 30 is the same as above except that the bumps 21 are electrically and mechanically connected to the conductor layers 24 (e.g., the electrodes 13A, 13B, and 15) of the chip 10. Also in this case, the bumps 21 are bonded to the conductor layers 24 by interdiffusion between the atoms, in a solid phase, of the respective metals of which the bumps and the conductor layers are made, without involving melting of the respective metals of which the bumps and the conductor layers are made.

In this manner, the packaged piezoelectric resonant filter 1 is manufactured. The piezoelectric resonant filter 1 can be soldered to another substrate at the vicinity of each end-face through-hole 39 of the mounting substrate 30, to be thereby electrically connected and mechanically fixed to the substrate.

As described above, in the piezoelectric resonant filter 1 according to the embodiment, the chip 10 has the series resonator 16 and the parallel resonator 17. The series resonator 16 is a thin-film piezoelectric resonator including the lower electrode 13A, the upper electrode 15, and the piezoelectric thin film 14 disposed therebetween. On the other hand, the parallel resonator 17 is a thin-film piezoelectric resonator including the lower electrode 13B, the upper electrode 15, and the piezoelectric thin film 14 disposed therebetween. The series resonator 16 and the parallel resonator 17 constitute a ladder filter circuit.

In the piezoelectric resonant filter 1 according to the embodiment, one of the conductors 32 and 33 serves as the input terminal of the filter circuit while the other serving as the output terminal of the filter circuit.

Figure 14:
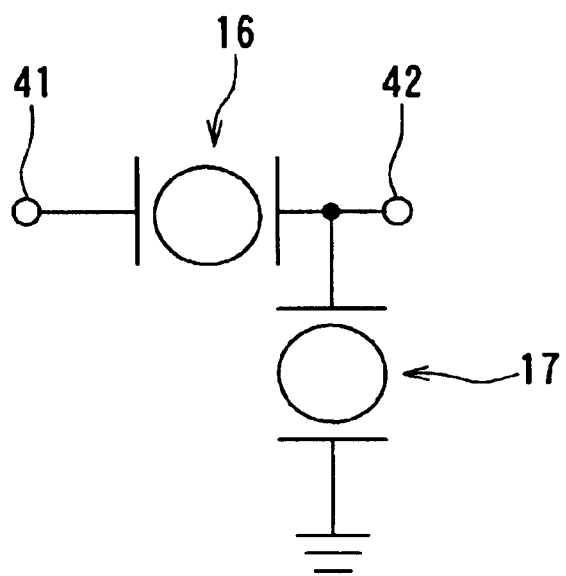
FIG. 14 is a circuit diagram illustrating an example of a configuration of a filter circuit of the first embodiment of the invention.

FIG. 14 is a circuit diagram illustrating a configuration of the filter circuit where the conductor 33 serves as the input terminal and the conductor 32 serves as the output terminal. In the configuration shown in FIG. 14, one end of the series resonator 16 is connected to the input terminal 41, while the other end is connected to the output terminal 42. One end of the parallel resonator 17 is connected to the connecting point between the series resonator 16 and the output terminal 42. The other end of the parallel resonator 17 is grounded.

Figure 15:
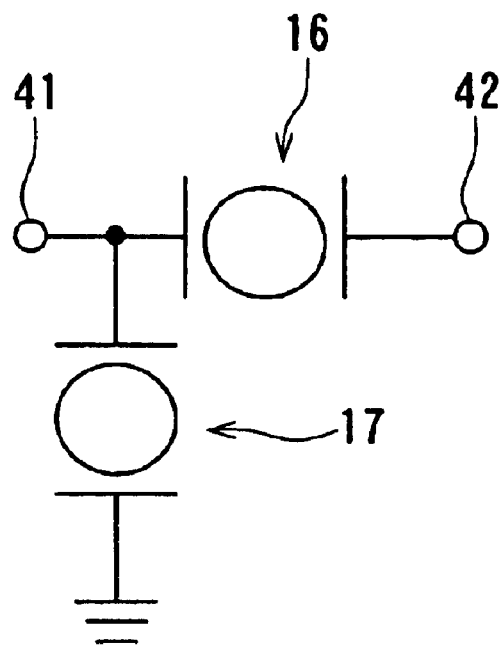
FIG. 15 is a circuit diagram illustrating another example of the configuration of the filter circuit of the first embodiment of the invention.

FIG. 15 is a circuit diagram illustrating a configuration of the filter circuit where the conductor 32 serves as the input terminal and the conductor 33 serves as the output terminal. In the configuration shown in FIG. 15, one end of the series resonator 16 is connected to the input terminal 41, while the other end is connected to the output terminal 42. One end of the parallel resonator 17 is connected to the connecting point between the series resonator 16 and the input terminal 41. The other end of the parallel resonator 17 is grounded.

Next, the function of the piezoelectric resonant filter 1 according to the embodiment will be described. The piezoelectric resonant filter 1 according to the embodiment has the ladder filter circuit including the series resonator 16 and the parallel resonator 17.

In the series resonator 16, a high-frequency exciting voltage is applied to between the lower electrode 13A and the upper electrode 15. This exciting voltage is applied to the piezoelectric thin film 14. This causes a portion of the piezoelectric thin film 14 located between the lower electrode 13A and the upper electrode 15 to be excited to produce therein a longitudinal wave traveling in the direction of the thickness of this portion. This portion resonates when the frequency of the exciting voltage equals to a predetermined resonant frequency.

Likewise, in the parallel resonator 17, a high-frequency exciting voltage is applied to between the lower electrode 13B and the upper electrode 15. This exciting voltage is applied to the piezoelectric thin film 14. This causes a portion of the piezoelectric thin film 14 located between the lower electrode 13B and the upper electrode 15 to be excited to produce therein a longitudinal wave traveling in the direction of the thickness of this portion. This portion resonates when the frequency of the exciting voltage equals to a predetermined resonant frequency.

In the piezoelectric resonant filter 1 according to the embodiment, for example, the resonant frequency of the series resonator 16 and the anti-resonant frequency of the parallel resonator 17 are tuned to the center frequency of a desired passband of the filter circuit. In this case, the frequency range from the resonant frequency of the parallel resonator 17 to the anti-resonant frequency of the series resonator 16 is the passband of the filter circuit. Thus, for the piezoelectric resonant filter 1, it is important to accurately control the resonant frequency and anti-resonant frequency of each of the resonators 16 and 17.

Figure 16:
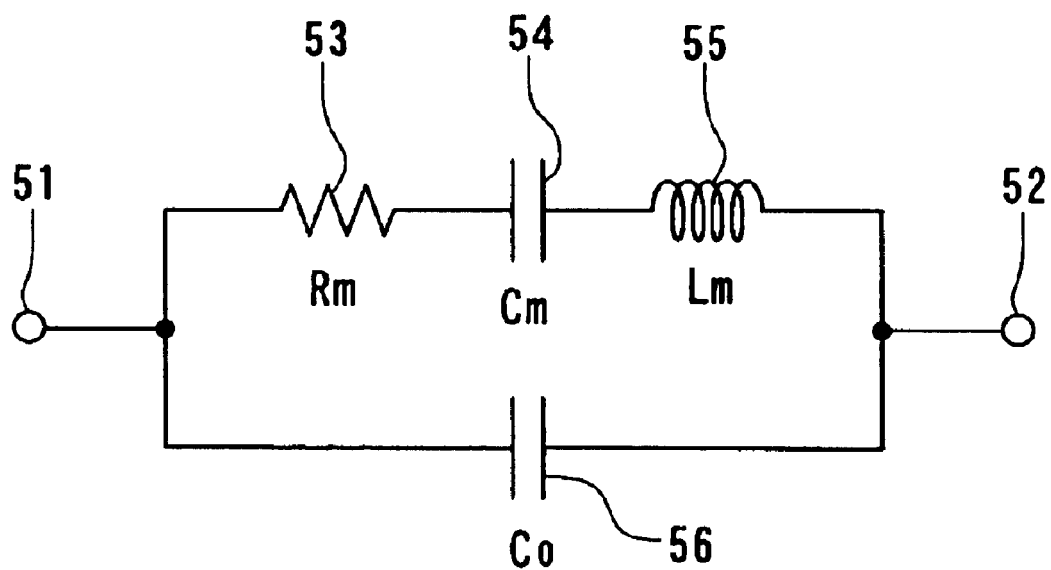
FIG. 16 is a circuit diagram illustrating an equivalent circuit of a thin-film piezoelectric resonator.

FIG. 16 shows a BVD (Butterworth-Van Dyke) equivalent circuit of the thin-film piezoelectric resonator used as the series resonator 16 and the parallel resonator 17. This equivalent circuit comprises two terminals 51 and 52, a resistor 53 one end of which is connected to the terminal 51, a capacitor 54 one end of which is connected to the other end of the resistor 53, an inductor 55 one end of which is connected to the other end of the capacitor 54 and the other end of which is connected to the terminal 52, and a capacitor 56 one end of which is connected to the terminal 51 and the other end of which is connected to the terminal 52. Here, the resistance of the resistor 53 is expressed as Rm, the capacitance of the capacitor 54 as Cm, the inductance of the inductor 55 as Lm, and the capacitance of the capacitor 56 as Co. The resistance Rm is called the resonant resistance, the capacitance Cm is called the equivalent capacitance, and the inductance Lm is called the equivalent inductance. The capacitance Co is a damping capacitance.

Figure 17:
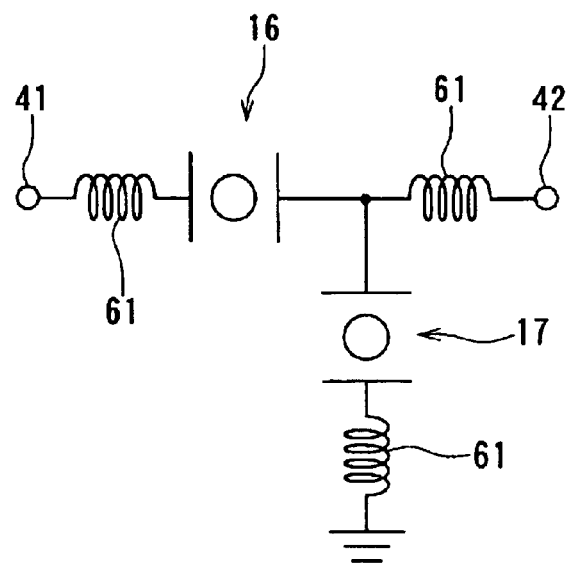
FIG. 17 is a circuit diagram illustrating a configuration of a filter circuit formed by adding an extra inductor to the circuit shown in FIG. 14.

Now, consider a case where a chip containing the components of the filter circuit shown in FIG. 14 is formed, and then the chip is mounted on a mounting substrate by wire bonding. In this case, the wire produces an extra parasitic inductance between the chip and the mounting substrate. FIG. 17 illustrates a configuration of a filter circuit which includes an inductor having the extra parasitic inductance. In the filter circuit shown in FIG. 17, an extra inductor 61 is inserted in between one end of the series resonator 16 and the input terminal 41, between the other end of the series resonator 16 (one end of the parallel resonator 17) and the output terminal 42, and between the other end of the parallel resonator 17 and the ground. It is known that a wire for use in wire bonding generates an inductance of about 1 nH per 1 mm at a frequency of 0.8 GHz. Therefore, the inductance of the inductor 61 shown in FIG. 17 is expected to be on the order of several nH at maximum.

Even if the chip is prepared so that desired electrical properties of the filter can be achieved with the filter circuit shown in FIG. 14, an extra inductor 61 formed by the wire as mentioned above would make the filter circuit actually be the one shown in FIG. 17. As a result, the properties of the filter circuit would shift from the desired properties.

In contrast, in the present embodiment, the chip 10 is mounted on the mounting substrate 30 by flip chip bonding. This causes no extra inductor 61 due to a wire, and therefore the electrical properties of the filter circuit will not shift from the desired properties.

Next, the results of simulations performed to examine the effects of the extra inductor 61 formed by the wire will be described. The simulations were based on the filter circuit shown in FIG. 14 as a filter circuit where the chip 10 is mounted on the mounting substrate 30 by flip chip bonding. The simulations were also based on the filter circuit shown in FIG. 17 as a filter circuit where the chip is mounted on the mounting substrate by wire bonding. Also, the simulations were performed with the series resonator 16 or the parallel resonator 17 replaced with the equivalent circuit shown in FIG. 16. In the simulations, frequency characteristics of $S_{21}$ parameter representing the transmission characteristics (amount of attenuation) of each of the filter circuits shown in FIG. 14 and FIG. 17 were determined by calculation.

Figure 18:
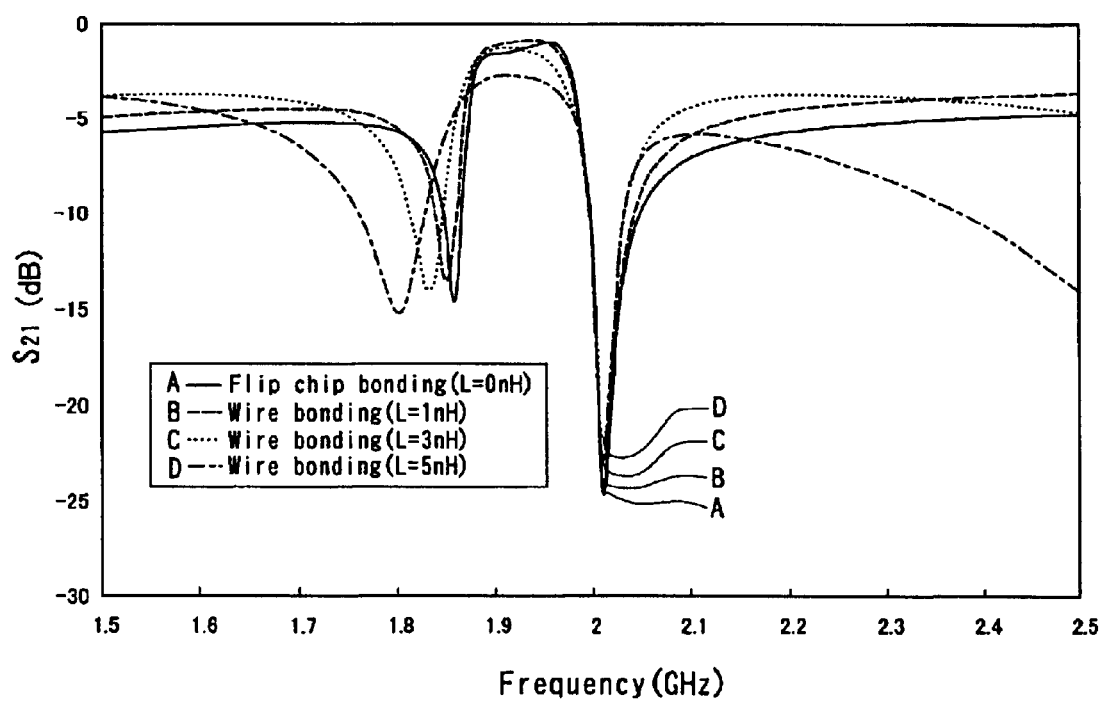
FIG. 18 is a plot illustrating the results of a first simulation in the first embodiment of the invention.

First, description will be given as to the results of a first simulation performed on the filter circuit shown in FIG. 14, which was designed to have a center frequency of 1.93 GHz. As the filter circuit shown in FIG. 17, designed were three types of filter circuits in which the inductance L of the inductor 61 was set to three values of 1 nH, 3 nH, and 5 nH, respectively, and conditions other than the inductor 61 were the same as those of the filter circuit shown in FIG. 14. The results of the simulation are shown in FIG. 18 and the table below. FIG. 18 illustrates the frequency characteristics of the $S_{21}$ parameter. The table below shows the center frequency, insertion loss, and passband width. Here, the passband is defined as a frequency band between two frequencies at which the $S_{21}$ parameter has a value lower by 3 dB than the value at the minimum insertion loss, and the passband width is defined as the width of this passband. The center frequency is a frequency at the center of the passband.

TABLE 1

| Bonding method | Center frequency (GHz) | Insertion loss (dB) | Passband width (−3 dB) (MHz) |
| --- | --- | --- | --- |
| Flip chip bonding (L = 0 nH) | 1.93 | 0.98 | 100 |
| Wire bonding (L = 1 nH) | 1.93 | 0.89 | 110 |
| Wire bonding (L = 3 nH) | 1.93 | 1.26 | 110 |
| Wire bonding (L = 5 nH) | 1.92 | 2.75 | 140 |

From the results of the first simulation, it can be seen that as the inductance L of the inductor 61 increases, the center frequency is sifted towards lower frequencies, and the insertion loss and the passband width increase. From FIG. 18, it can also be seen that as the inductance L of the inductor 61 increases, the shape of the curve indicative of the frequency characteristics of the $S_{21}$ parameter degrades and the amount of attenuation in the attenuation band reduces. These tendencies become outstanding especially when the inductance L of the inductor 61 is 3 nH or more. From the results of the first simulation, it has become apparent that the extra inductor 61 formed by the wire degrades the electrical properties of the filter circuit.

Figure 19:
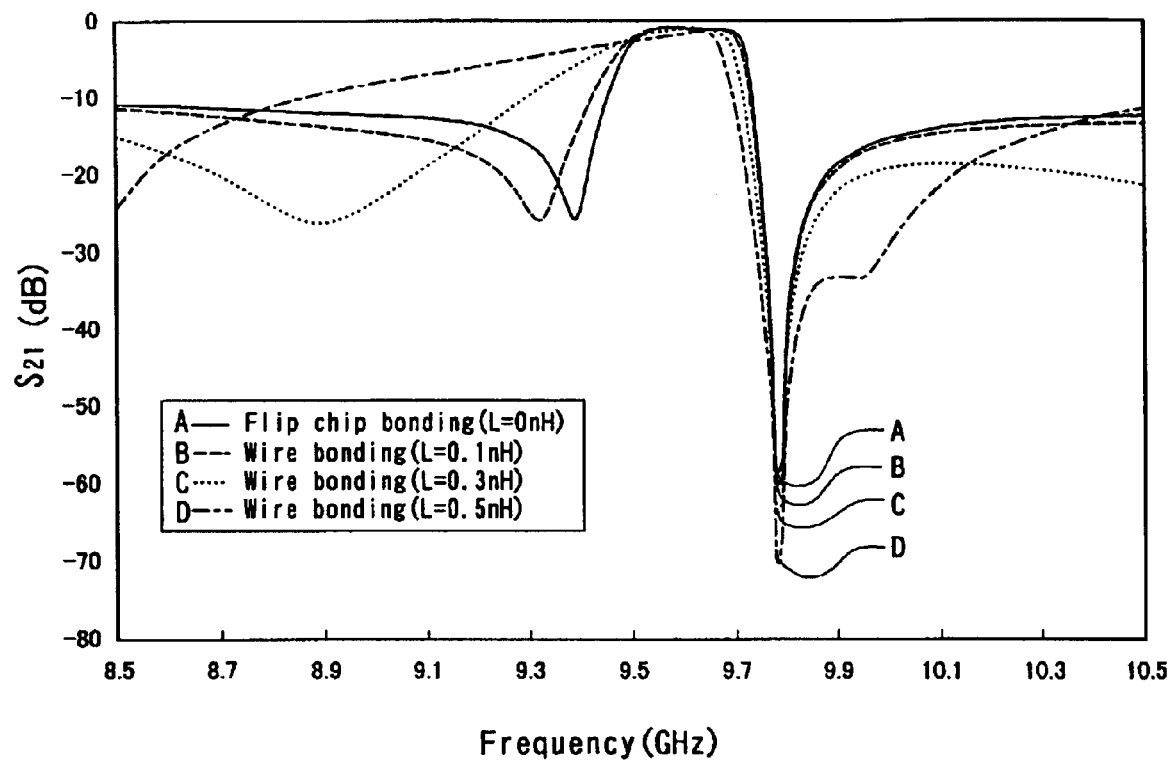
FIG. 19 is a plot illustrating the results of a second simulation in the first embodiment of the invention.

Next, description will be given as to the results of a second simulation performed on the filter circuit shown in FIG. 14, which was designed to have a center frequency of 9.61 GHz. As the filter circuit shown in FIG. 17, designed were three types of filter circuits in which the inductance L of the inductor 61 was set to three values of 0.1 nH, 0.3 nH, and 0.5 nH, respectively, and conditions other than the inductor 61 were the same as those of the filter circuit shown in FIG. 14. The results of the simulation are shown in FIG. 19 and the table below. FIG. 19 illustrates the frequency characteristics of the $S_{21}$ parameter. The table below shows the center frequency, insertion loss, and passband width.

TABLE 2

| Bonding method | Center frequency (GHz) | Insertion loss (dB) | Passband width (−3 dB) (MHz) |
| --- | --- | --- | --- |
| Flip chip bonding (L = 0 nH) | 9.61 | 0.91 | 230 |
| Wire bonding (L = 0.1 nH) | 9.60 | 0.91 | 240 |
| Wire bonding (L = 0.3 nH) | 9.57 | 1.16 | 260 |
| Wire bonding (L = 0.5 nH) | 9.49 | 1.90 | 380 |

The results of the second simulation show the same tendency as the first simulation. The results of the second simulation also show that at high frequencies of nearly 10 GHz, an inductance L of the inductor 61 even as low as 0.1 to 0.5 nH can cause a considerable deterioration of the electrical properties of the filter circuit. This indicates that piezoelectric resonant filters used at high frequency bands of several GHz to about 10 GHz will significantly deteriorate in characteristics due to the extra inductor 61 formed by wires used in a wire bonding method.

As described in the foregoing, according to the piezoelectric resonant filter 1 of the present embodiment and the manufacturing method thereof, the chip 10 having the series resonator 16 and the parallel resonator 17 each made of a thin-film piezoelectric resonator is mounted on the mounting substrate 30 by flip chip bonding. This can preclude any shifts of the electrical properties of the filter related to mounting of the chip 10 onto the mounting substrate 30. Furthermore, according to the embodiment, as compared with the case where the chip is mounted on the mounting substrate by wire bonding, the package can be reduced in thickness (height), length and width, which allows miniaturization of the filter.

Furthermore, according to the embodiment, the bumps 21 provided on the chip 10 are bonded to the conductors 32, 33, and 35, or the bumps 21 provided on the mounting substrate 30 are bonded to the conductor layers 24 of the chip 10, by interdiffusion between the atoms, in a solid phase, of the respective metals of which the bumps and the conductors or the conductor layers are made, without involving melting of the respective metals of which the bumps and the conductors or the conductor layers are made. Therefore, according to the embodiment the thin-film piezoelectric resonator cannot be contaminated by any flux residue or the like, unlike the case where the solder bumps are connected to the connection pads of the mounting substrate by flip chip bonding. Thus, the embodiment can preclude any shift or deterioration of the electrical properties of the filters related to mounting of the chip 10 onto the mounting substrate 30.

According to the embodiment, the bumps 21 are bonded to the conductors 32, 33, 35, or to the conductor layers 24 by interdiffusion between the atoms, in a solid phase, of the respective metals of which the bumps and the conductors or the conductor layers are made. Reliability of the electrical connection therebetween is thereby improved.

In the embodiment, when bonding of the bumps 21 to the conductors 32, 33, 35 or to the conductor layers 24 is performed while applying an ultrasonic wave, it is possible to effect the bonding in a shorter period of time and at a lower temperature compared with the case where no ultrasonic wave is applied. When bonding of the bumps 21 to the conductors 32, 33, 35 or to the conductor layers 24 is performed while applying an ultrasonic wave, the time required for the bonding can be one second or less, for example.

The filter circuit of the piezoelectric resonant filter according to the embodiment may employ the filter circuit shown in FIG. 14 or FIG. 15 as the basic configuration, and may be made up of a plurality of the basic configurations connected in a cascaded manner. In this case, the chip 10 has a plurality of series resonators 16 and a plurality of parallel resonators 17.

[Second Embodiment]

Figure 20:
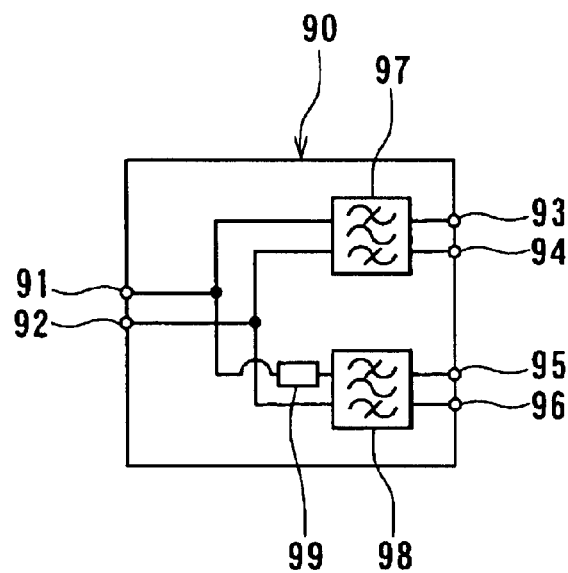
FIG. 20 is a circuit diagram of a duplexer according to a second embodiment of the invention.

Now, description will be given of a duplexer according to a second embodiment of the invention. FIG. 20 is a circuit diagram of the duplexer according to the embodiment. The duplexer 90 according to the embodiment has antenna terminals 91 and 92 connected to an antenna (not shown), transmission signal terminals 93 and 94 connected to a transmission circuit (not shown) for delivering a transmission signal to the antenna, and reception signal terminals 95 and 96 connected to a reception circuit (not shown) for receiving a reception signal from the antenna.

Furthermore, the duplexer 90 includes a first filter 97 that allows a transmission signal to pass therethrough and interrupts a reception signal, and a second filter 98 that allows the reception signal to pass therethrough and interrupts the transmission signal. The filters 97 and 98 each have two input terminals and two output terminals.

The two input terminals of the filter 97 are connected to the transmission signal terminals 93 and 94, respectively. The two output terminals of the filter 97 are connected to the antenna terminals 91 and 92, respectively. One of the input terminals of the filter 98 is connected to the antenna terminal 91 via a quarter wave phase converter 99, while the other of the input terminals is connected to the antenna terminal 92. The two output terminals of the filter 98 are connected to the reception signal terminals 95 and 96, respectively.

In the duplexer 90 according to the embodiment, the piezoelectric resonant filter of the first embodiment is used for at least one of the filters 97 and 98. When both of the filters 97 and 98 are the piezoelectric resonant filters of the first embodiment, the filters 97 and 98 can share the same mounting substrate.

The method of manufacturing the duplexer 90 according to the embodiment includes the step of manufacturing the filter 97 and the step of manufacturing the filter 98. At least one of the steps of manufacturing the filter 97 and manufacturing the filter 98 includes the step of manufacturing the piezoelectric resonant filter of the first embodiment. The step of manufacturing the piezoelectric resonant filter includes the steps of fabricating a chip of the piezoelectric resonant filter, fabricating a mounting substrate, forming bumps, and mounting the chip on the mounting substrate by flip chip bonding. In the step of mounting, the bumps provided on the chip are bonded to the conductors of the mounting substrate, or the bumps provided on the mounting substrate are bonded to the conductor layers of the chip by interdiffusion between the atoms of the respective metals of which the bumps and the conductors or the conductor layers are made, without involving melting of the respective metals of which the bumps and the conductors or the conductor layers are made. Furthermore, in the step of mounting, an ultrasonic wave may be applied to the bumps to accelerate the interdiffusion between the atoms of the metals.

Figure 21:
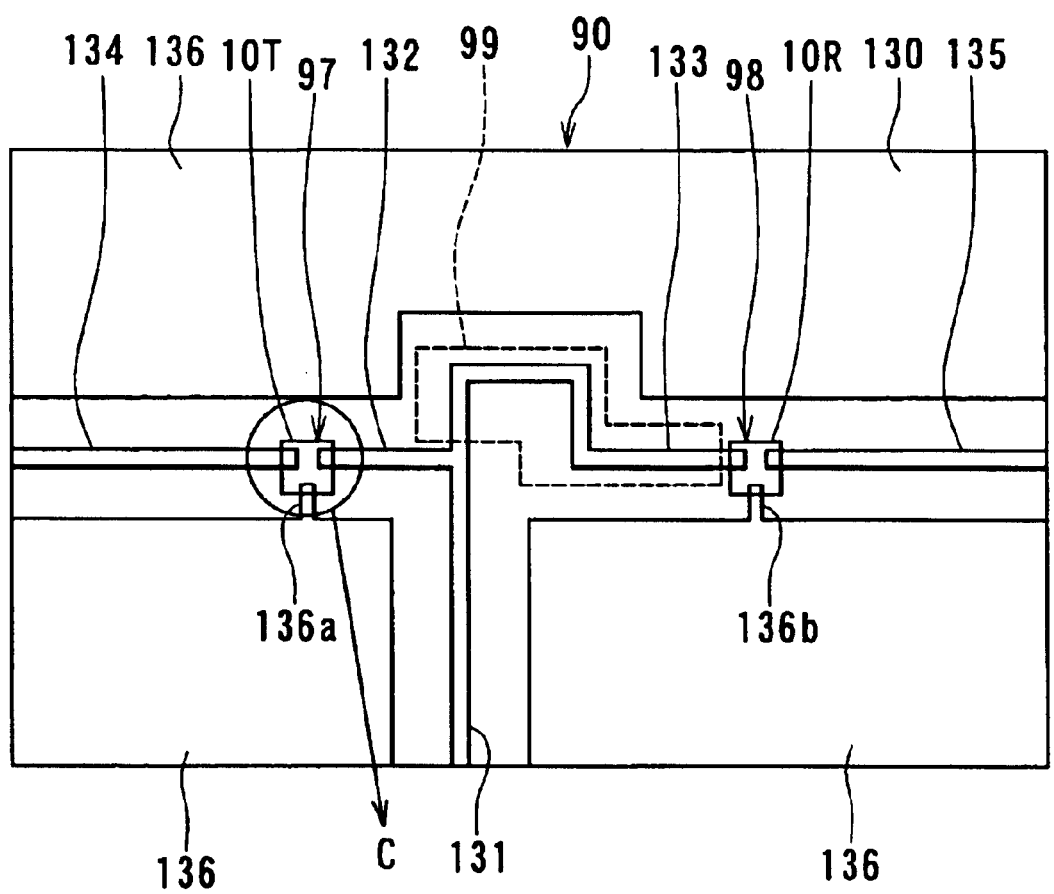
FIG. 21 is a top view illustrating an example of a configuration of the duplexer according to the second embodiment of the invention.
Figure 22:
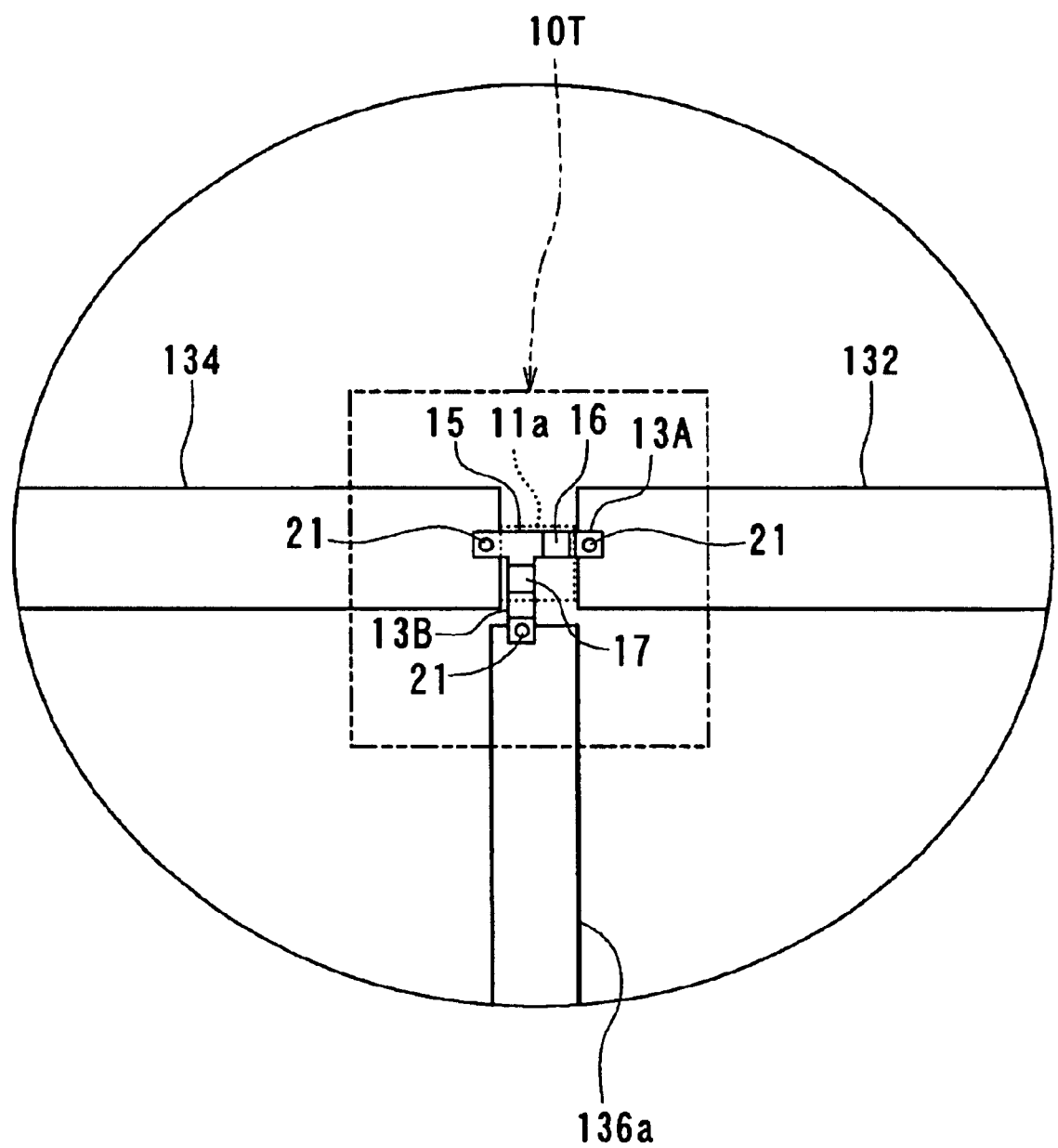
FIG. 22 is an enlarged top view of portion C of FIG. 21.

Now, description will be given of an example in which both of the filters 97 and 98 are the piezoelectric resonant filters of the first embodiment, and the filters 97 and 98 share the same mounting substrate. FIG. 21 is a top view of the duplexer 90 in this example. FIG. 22 is an enlarged top view of the portion C of FIG. 21.

In this example, as shown in FIG. 21, the duplexer 90 includes a mounting substrate 130, and a transmission chip 10T and a reception chip 10R that are mounted on the mounting substrate 130 by flip chip bonding. The chip 10T and the chip 10R are mounted on the mounting substrate 130 in the same way as in the first embodiment.

On one of surfaces of the mounting substrate 130, there are provided a conductor 131 one end of which is connected to an antenna (not shown), a transmission conductor 132 and a reception conductor 133 one end of each of which is connected to the other end of the conductor 131, a transmission conductor 134 one end of which is opposed to the other end of the transmission conductor 132 at a predetermined distance therefrom, and a reception conductor 135 one end of which is opposed to the other end of the reception conductor 133 at a predetermined distance therefrom. The other end of the transmission conductor 134 is connected to a transmission circuit (not shown). The other end of the transmission conductor 134 corresponds to the transmission signal terminal 93. The other end of the reception conductor 135 is connected to a reception circuit (not shown). The other end of the reception conductor 135 corresponds to the reception signal terminal 95. The one end of the conductor 131 corresponds to the antenna terminal 91.

A portion of the reception conductor 133 is bent in the shape of a hook, and the portion serves as the quarter wave phase converter 99. Ground conductors 136 in FIG. 21 correspond to the terminals 92, 94, 96 in FIG. 20 and portions of the signal lines connected thereto.

On the one of the surfaces of the mounting substrate 130, there is further provided the ground conductors 136. The ground conductors 136 occupy most part of the one of the surfaces of the mounting substrate 130. The ground conductors 136 are located at a predetermined distance from each of the conductors 131 to 135. The ground conductors 136 include a projection 136a that protrudes towards the area where the ends of the conductors 132 and 134 are opposed to each other, and a projection 136b that protrudes towards the area where the ends of the conductors 133 and 135 are opposed to each other.

The transmission chip 10T is disposed at the area where the ends of the conductors 132 and 134 are opposed to each other, and is electrically connected to those ends of the conductors 132 and 134 and to the end of the projection 136a. The reception chip 10R is disposed at the area where the ends of the conductors 133 and 135 are opposed to each other, and is electrically connected to those ends of the conductors 133 and 135 and to the end of the projection 136b. The chips 10T and 10R each have the same configuration as that of the chip 10 of the first embodiment. However, the transmission chip 10T and the reception chip 10R are different from each other in that their respective upper electrodes 15 are different in thickness to thereby provide different passbands.

As shown in FIG. 22, in the transmission chip 10T, the lower electrode 13A is electrically connected to the transmission conductor 132 via a bump 21. The lower electrode 13B is electrically connected to the projection 136a of the ground conductor 136 via a bump 21. The upper electrode 15 is electrically connected to the transmission conductor 134 via a bump 21. The filter 97 is thus completed.

Likewise, although not shown, in the reception chip 10R the lower electrode 13A is electrically connected to the reception conductor 135 via a bump 21. The lower electrode 13B is electrically connected to the projection 136b of the ground conductor 136 via a bump 21. The upper electrode 15 is electrically connected to the reception conductor 133 via a bump 21. The filter 98 is thus completed.

In the duplexer 90 according to the embodiment, a transmission signal from the transmission circuit is fed to the antenna through the filter 97. On the other hand, a reception signal from the antenna passes through the quarter wave phase converter 99 to be converted into a signal having a phase shifted by a quarter of the wavelength, and is then fed to the reception circuit through the filter 98.

In the duplexer 90 according to the embodiment, the piezoelectric resonant filter according to the first embodiment is used as at least one of the filters 97 and 98. Therefore, according to the embodiment, it is possible to preclude any shifts of the electrical properties of the filter related to mounting of the chip onto the mounting substrate.

The remainder of the configuration, functions and effects of the present embodiment are the same as those of the first embodiment.

The present invention is not limited to the foregoing embodiments but may be modified in various ways. For example, the material of the mounting substrate 30 may be ceramic.

As described in the foregoing, in the piezoelectric resonant filter, the duplexer, and the manufacturing method thereof according to the invention, the chip having the thin-film piezoelectric resonator is mounted on the mounting substrate by flip chip bonding. Furthermore, in the invention, the bumps provided on the chip-side conductors are bonded to the substrate-side conductors, or the bumps provided on the substrate-side conductors are bonded to the chip-side conductors, by interdiffusion between atoms of the respective metals of which the bumps and the conductors are made, without involving melting of the respective metals of which the bumps and the conductors are made. Therefore, the invention makes it possible to preclude any shifts or deterioration of the electrical properties of the filter related to mounting of the chip onto the mounting substrate, and to improve reliability of the electrical connection between the chip and the mounting substrate.

It is apparent from the foregoing description that the invention may be carried out in various modes and may be modified in various ways. It is therefore to be understood that within the scope of equivalence of the appended claims the invention may be practiced in modes other than the foregoing best modes.

What is claimed is:

1. A method of manufacturing a piezoelectric resonant filter including a thin-film piezoelectric resonator, the thin-film piezoelectric resonator having a piezoelectric thin film with a piezoelectric property and two exciting electrodes disposed on both surfaces of the piezoelectric thin film to apply an exciting voltage to the piezoelectric thin film, the piezoelectric resonant filter comprising a chip having the thin-film piezoelectric resonator, and a mounting substrate on which the chip is mounted, wherein the chip has: a plurality of chip-side conductors made of a metal, the chip-side conductors being connected to the exciting electrodes or constituting the exciting electrodes: a plurality of bumps provided on the chip-side conductors; and a conductor layer disposed between each of the chip-side conductors and each of the bumps, the conductor layer being made of a metal different from the respective metals of which the bumps and the conductors are made, and the mounting substrate has a plurality of substrate-side conductors that are made of a metal and to be electrically connected to the chip-side conductors, the method of manufacturing the piezoelectric resonant filter comprising the steps of:
fabricating the chip;
fabricating the mounting; and
mounting the chip on the mounting substrate by flip chip bonding such that the chip-side conductors and the substrate-side conductors are electrically and mechanically connected to each other via the bumps, wherein
in the step of mounting, the bumps are bonded to the substrate-side conductors by interdiffusion between atoms of the respective metals of which the bumps and the conductors are made, without involving melting of the respective metals of which the bumps and the conductors are made.

2. A method of manufacturing a piezoelectric resonant filter according to claim 1, wherein, in the step of mounting, an ultrasonic wave is applied to the bumps to accelerate the interdiffusion between the atoms of the metals.

3. A piezoelectric resonant filter including a thin-film piezoelectric resonator, the thin-film piezoelectric resonator having a piezoelectric thin film with a piezoelectric property and two exciting electrodes disposed on both surfaces of the piezoelectric thin film to apply an exciting voltage to the piezoelectric thin film, the piezoelectric resonant filter comprising:
a chip having the thin-film piezoelectric resonator; and
a mounting substrate on which the chip is mounted, wherein:
the chip has a plurality of chip-side conductors made of a metal, the chip-side conductors being connected to the exciting electrodes or constituting the exciting electrodes, and a plurality of bumps provided on the chip-side conductors;
the mounting substrate has a plurality of substrate-side conductors that are made of a metal and to be electrically connected to the chip-side conductors;
the chip is mounted on the mounting substrate by flip chip bonding such that the chip-side conductors and the substrate-side conductors are electrically and mechanically connected to each other via the bumps;
the bumps are bonded to the substrate-side conductors by interdiffusion between atoms of the respective metals of which the bumps and the conductors are made, without involving melting of the respective metals of which the bumps and the conductors are made; and
the chip further has a conductor layer disposed between each of the chip-side conductors and each of the bumps, the conductor layer being made of a metal different from the respective metals of which the bumps and the conductors are made.

4. A piezoelectric resonant filter according to claim 3, wherein the conductor layer is made of titanium or nickel.

5. A piezoelectric resonant filter according to claim 3, wherein the chip includes a series resonator and a parallel resonator each formed of the thin-film piezoelectric resonator, the series resonator and the parallel resonator constituting a ladder filter circuit.

6. A piezoelectric resonant filter according to claim 3, wherein the bumps are made of gold.

7. A duplexer comprising a first filter that allows a transmission signal to pass therethrough and interrupts a reception signal, and a second filter that allows the reception signal to pass therethrough and interrupts the transmission signal, the duplexer being connected to an antenna,
wherein at least one of the first and second filters is a piezoelectric resonant filter including a thin-film piezoelectric resonator, the thin-film piezoelectric resonator having a piezoelectric thin film with a piezoelectric property and two exciting electrodes disposed on both surfaces of the piezoelectric thin film to apply an exciting voltage to the piezoelectric thin film, the piezoelectric resonant filter comprising:

a chip having the thin-film piezoelectric resonator; and
a mounting substrate on which the chip is mounted,
wherein:
- the chip has a plurality of chip-side conductors made of a metal, the chip-side conductors being connected to the exciting electrodes or constituting the exciting electrodes, a plurality of bumps provided on the chip-side conductors, and a conductor layer disposed between each of the chip-side conductors and each of the bumps, the conductor layer being made of a metal different from the respective metals of which the bumps and the conductors are made;
- the mounting substrate has a plurality of substrate-side conductors that are made of a metal and to be electrically connected to the chip-side conductors;
- the chip is mounted on the mounting substrate by flip chip bonding such that the chip-side conductors and the substrate-side conductors are electrically and mechanically connected to each other via the bumps; and
- the bumps are bonded to the substrate-side conductors by interdiffusion between atoms of the respective metals of which the bumps and the conductors are made, without involving melting of the respective metals of which the bumps and the conductors are made.

8. A method of manufacturing a duplexer comprising a first filter that allows a transmission signal to pass therethrough and interrupts a reception signal, and a second filter that allows the reception signal to pass therethrough and interrupts the transmission signal, the duplexer being connected to an antenna, wherein at least one of the first and second filters is a piezoelectric resonant filter including a thin-film piezoelectric resonator, the thin-film piezoelectric resonator having a piezoelectric thin film with a piezoelectric property and two exciting electrodes disposed on both surfaces of the piezoelectric thin film to apply an exciting voltage to the piezoelectric thin film, the piezoelectric resonant filter comprising a chip having the thin-film piezoelectric resonator, and a mounting substrate on which the chip is mounted, wherein: the chip has: a plurality of chip-side conductors made of a metal, the chip-side conductors being connected to the exciting electrodes or constituting the exciting electrodes; a plurality of bumps provided on the chip-side conductors; and a conductor layer disposed between each of the chip-side conductors and each of the bumps, the conductor layer being made of a metal different from the respective metals of which the bumps and the conductors are made; and the mounting substrate has a plurality of substrate-side conductors that are made of a metal and to be electrically connected to the chip-side conductors, the method of manufacturing the duplexer comprising:

the step of manufacturing the first filter and the step of manufacturing the second filter, wherein at least one of the steps of manufacturing the first filter and manufacturing the second filter includes the step of manufacturing the piezoelectric resonant filter, the step of manufacturing the piezoelectric resonant filter including the steps of:

fabricating the chip of the piezoelectric resonant filter;
fabricating the mounting substrate; and
mounting the chip on the mounting substrate by flip chip bonding such, that the chip-side conductors and the substrate-side conductors are electrically and mechanically connected to each other via the bumps, wherein in the step of mounting, the bumps are bonded to the substrate-side conductors by interdiffusion between atoms of the respective metals of which the bumps and the conductors are made, without involving melting of the respective metals of which the bumps and the conductors are made.

9. A method of manufacturing a duplexer according to claim 8, wherein, in the step of mounting, an ultrasonic wave is applied to the bumps to accelerate the interdiffusion between the atoms of the metals.

* * * * *

UNITED STATES PATENT AND TRADEMARK OFFICE
CERTIFICATE OF CORRECTION

PATENT NO. : 6,778,038 B2
DATED : August 17, 2004
INVENTOR(S) : Taku Takeishi, Katsuhiko Gunji and Eiju Komuro It is certified that error appears in the above-identified patent and that said Letters Patent is hereby corrected as shown below:

Column 19,
Line 65, insert -- substrate -- after "mounting".

Column 22,
Line 25, replace "such, that" with -- such that --.

Signed and Sealed this

Eighteenth Day of January, 2005

JON W. DUDAS
*Director of the United States Patent and Trademark Office*